United States Patent
Komatsu et al.

(10) Patent No.: US 8,450,158 B2
(45) Date of Patent: May 28, 2013

(54) METHOD FOR FORMING MICROCRYSTALLINE SEMICONDUCTOR FILM AND METHOD FOR MANUFACTURING SEMICONDUCTOR DEVICE

(75) Inventors: Ryu Komatsu, Isehara (JP); Yasuhiro Jinbo, Atsugi (JP); Hidekazu Miyairi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/282,650

(22) Filed: Oct. 27, 2011

(65) Prior Publication Data

US 2012/0115285 A1  May 10, 2012

(30) Foreign Application Priority Data

Nov. 4, 2010  (JP) ................. 2010-247527

(51) Int. Cl.
*H01L 21/336* (2006.01)
*H01L 21/365* (2006.01)

(52) U.S. Cl.
USPC ........... 438/151; 438/157; 438/479; 438/482; 257/E21.412

(58) Field of Classification Search
USPC ............. 438/151, 157, 166, 479, 482, 488; 257/E21.09, E21.412
See application file for complete search history.

(56) References Cited

U.S. PATENT DOCUMENTS

| 4,409,134 A | 10/1983 | Yamazaki |
| 5,453,858 A | 9/1995 | Yamazaki |
| 5,514,879 A | 5/1996 | Yamazaki |
| 5,571,578 A | 11/1996 | Kaji et al. |
| 5,582,880 A | 12/1996 | Mochizuki et al. |
| 5,591,987 A | 1/1997 | Yamazaki et al. |
| 5,614,732 A | 3/1997 | Yamazaki |
| 5,648,293 A | 7/1997 | Hayama et al. |

(Continued)

FOREIGN PATENT DOCUMENTS

| EP | 0535979 A | 4/1993 |
| JP | 04-242724 A | 8/1992 |

(Continued)

OTHER PUBLICATIONS

Arai.T et al., "41.2: Micro Silicon Technology for Active Matrix OLED Display", SID Digest '07 : SID International Symposium Digest of Technical Papers, 2007, vol. 38, pp. 1370-1373.

(Continued)

*Primary Examiner* — Tuan N. Quach
(74) *Attorney, Agent, or Firm* — Eric J. Robinson; Robinson Intellectual Property Law Office, P.C.

(57) ABSTRACT

A seed crystal which includes mixed phase grains including an amorphous silicon region and a crystallite which is a microcrystal that can be regarded as a single crystal is formed on an insulating film by a plasma CVD method under a first condition that enables mixed phase grains having high crystallinity and high uniformity of grain sizes to be formed at a low density, and then a microcrystalline semiconductor film is formed to be stacked on the seed crystal by a plasma CVD method under a second condition that enables the mixed phase grains to grow to fill a space between the mixed phase grains.

18 Claims, 15 Drawing Sheets

U.S. PATENT DOCUMENTS

| | | | |
|---|---|---|---|
| 5,677,236 | A | 10/1997 | Saitoh et al. |
| 5,701,167 | A | 12/1997 | Yamazaki |
| 5,849,601 | A | 12/1998 | Yamazaki |
| 5,859,445 | A | 1/1999 | Yamazaki |
| 6,011,277 | A | 1/2000 | Yamazaki |
| 6,023,075 | A | 2/2000 | Yamazaki |
| 6,153,893 | A | 11/2000 | Inoue et al. |
| 6,252,249 | B1 | 6/2001 | Yamazaki |
| 6,265,288 | B1 | 7/2001 | Okamoto et al. |
| 6,271,055 | B1 | 8/2001 | Yajima et al. |
| 6,281,520 | B1 | 8/2001 | Yamazaki |
| 6,306,213 | B1 | 10/2001 | Yamazaki |
| 6,344,420 | B1 | 2/2002 | Miyajima et al. |
| 6,468,839 | B2 | 10/2002 | Inoue et al. |
| 6,737,676 | B2 | 5/2004 | Yamazaki |
| 6,855,621 | B2 | 2/2005 | Kondo et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,551,655 | B2 | 6/2009 | Tanaka et al. |
| 7,576,360 | B2 | 8/2009 | Yamazaki |
| 7,611,930 | B2 * | 11/2009 | Yamazaki et al. ............ 438/151 |
| 7,833,845 | B2 | 11/2010 | Yamazaki et al. |
| 7,989,325 | B2 * | 8/2011 | Yokoi et al. .................. 438/479 |
| 2009/0002591 | A1 | 1/2009 | Yamazaki et al. |
| 2009/0033818 | A1 | 2/2009 | Nakajima et al. |
| 2009/0047759 | A1 | 2/2009 | Yamazaki et al. |
| 2009/0057683 | A1 | 3/2009 | Nakajima et al. |
| 2009/0061574 | A1 | 3/2009 | Nakajima et al. |
| 2009/0072237 | A1 | 3/2009 | Yamazaki et al. |
| 2009/0142909 | A1 * | 6/2009 | Jinbo et al. .................... 438/482 |
| 2010/0216285 | A1 | 8/2010 | Yokoi et al. |
| 2011/0020989 | A1 | 1/2011 | Tajima et al. |
| 2011/0039402 | A1 | 2/2011 | Yamazaki et al. |
| 2011/0059562 | A1 | 3/2011 | Yamazaki et al. |
| 2011/0278582 | A1 | 11/2011 | Tezuka et al. |
| 2011/0318888 | A1 * | 12/2011 | Komatsu et al. ............. 438/157 |
| 2012/0021570 | A1 * | 1/2012 | Tajima et al. ................ 438/157 |
| 2012/0100675 | A1 | 4/2012 | Komatsu et al. |
| 2012/0187408 | A1 * | 7/2012 | Tanaka et al. .................. 257/64 |

FOREIGN PATENT DOCUMENTS

| | | | |
|---|---|---|---|
| JP | 05-129608 A | 5/1993 | |
| JP | 05-275346 A | 10/1993 | |
| JP | 06-077483 A | 3/1994 | |
| JP | 07-045833 A | 2/1995 | |
| JP | 07-131030 A | 5/1995 | |
| JP | 07-162003 A | 6/1995 | |
| JP | 07-211708 A | 8/1995 | |
| JP | 09-232235 A | 9/1997 | |
| JP | 2000-174310 A | 6/2000 | |
| JP | 2000-269201 A | 9/2000 | |
| JP | 2000-277439 A | 10/2000 | |
| JP | 2001-053283 A | 2/2001 | |
| JP | 3201492 B | 8/2001 | |
| JP | 2002-206168 A | 7/2002 | |
| JP | 2002-246605 A | 8/2002 | |
| JP | 2002-280309 A | 9/2002 | |
| JP | 2003-037278 A | 2/2003 | |
| JP | 2004-200345 A | 7/2004 | |
| JP | 2005-049832 A | 2/2005 | |
| JP | 2005-167264 A | 6/2005 | |
| JP | 2005-191546 A | 7/2005 | |
| JP | 2006-237490 A | 9/2006 | |
| JP | 2009-044134 A | 2/2009 | |
| JP | 2009-076753 A | 4/2009 | |
| JP | 2009-088501 A | 4/2009 | |
| WO | 2011-142443 | 11/2011 | |

OTHER PUBLICATIONS

Lee.C et al., "How to Achieve High Mobility Thin Film Transistors by Direct Deposition of Silicon Using 13.56 MHZ RF PECVD?", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities", Appl. Phys. Lett. (Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced from Constant Current Stress Measurements", Appl. Phys. Lett. (Applied Physics Letters), Sep. 12, 2007, vol. 91, No. 11, pp. 113511-1-113511-3.

Lee.C et al., "Stability of NC-SI:H TFTS With Silicon Nitride Gate Dielectric", IEEE Transactions on Electron Devices, 2007, vol. 54, No. 1, pp. 45-51.

Sazonov.A et al., "Low-Temperature Materials and Thin Film Transistors for Flexible Electrons", Proceedings of the IEEE, Aug. 1, 2005, vol. 93, No. 8, pp. 1420-1428.

Lee.C et al., "Postdeposition Thermal Annealing and Material Stability of 75° C Hydrogenated Nanocrystalline Silicone Plasma-Enhanced Chemical Vapor Deposition Films,", J. Appl. Phys. (Journal of Applied Physics) , Aug. 4, 2005, vol. 98, No. 3, pp. 034305-1-034305-7.

* cited by examiner

200nm

200nm

200nm

200nm

METHOD FOR FORMING MICROCRYSTALLINE SEMICONDUCTOR FILM AND METHOD FOR MANUFACTURING SEMICONDUCTOR DEVICE

BACKGROUND OF THE INVENTION

1. Field of the Invention

One embodiment of the present invention relates to a method for forming a microcrystalline semiconductor film, a method for manufacturing a semiconductor device including the microcrystalline semiconductor film, and a display device.

In this specification, a semiconductor device means all types of devices which can function by utilizing semiconductor characteristics, and a display device, an electro-optical device, a photoelectric conversion device, a semiconductor circuit, and an electronic device are all semiconductor devices.

2. Description of the Related Art

As one type of field-effect transistor, a thin film transistor whose channel region is formed in a semiconductor film which is formed over a substrate having an insulating surface is known. Techniques in which amorphous silicon, microcrystalline silicon, or polycrystalline silicon is used for the semiconductor film where the channel region is formed in the thin film transistor have been disclosed (see Patent Documents 1 to 5). A typical application of the thin film transistor is a liquid crystal television device, in which the thin film transistor is practically used as a switching transistor in each pixel in a display screen.

In addition, a photoelectric conversion device has been developed in which a microcrystalline silicon film, which is a film of crystalline silicon capable of being formed by a plasma CVD method, is used as a semiconductor film having a function of photoelectric conversion (for example, see Patent Document 6).

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546
[Patent Document 6] Japanese Published Patent Application No. 2000-277439

SUMMARY OF THE INVENTION

A thin film transistor whose channel region is formed using an amorphous silicon film has problems of low field-effect mobility and low on-state current. On the other hand, a thin film transistor whose channel region is formed using a microcrystalline silicon film has a problem in that, though the field-effect mobility is improved, the off-state current is high as compared to the thin film transistor whose channel region is formed using an amorphous silicon film and thus sufficient switching characteristics cannot be obtained.

A thin film transistor whose channel region is formed using a polycrystalline silicon film has a field-effect mobility much higher than and on-state current higher than those of the above two kinds of thin film transistors. These features enable this kind of thin film transistor to be used not only as a switching transistor in a pixel but also as an element of a driver circuit that needs high-speed operation.

However, a manufacturing process of the thin film transistor whose channel region is formed using a polycrystalline silicon film involves a crystallization step for a semiconductor film and has a problem of higher manufacturing costs as compared to a manufacturing process of the thin film transistor whose channel region is formed using an amorphous silicon film. For example, a laser annealing technique necessary in the process for forming a polycrystalline silicon film prohibits efficient production of large-screen liquid crystal panels because an irradiation area of the laser beam is small.

The size of a glass substrate for manufacturing display panels has grown as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). The increase in size of glass substrate is based on the concept of minimum cost design.

However, a technique has not been established yet with which thin film transistors capable of high-speed operation can be manufactured with high productivity over a large-sized mother glass substrate such as the 10th generation mother glass substrate, which is a problem in the industry.

An object of one embodiment of the present invention is to provide a method for forming a microcrystalline semiconductor film having high crystallinity and high uniformity of grain sizes of mixed phase grains. Further, an object of one embodiment of the present invention is to provide a method for manufacturing a semiconductor device which has excellent electrical characteristics with high productivity.

According to one embodiment of the present invention, a seed crystal including mixed phase grains having high crystallinity and high uniformity of grain sizes at a low density is formed under a first condition, and then a microcrystalline semiconductor film is formed to be stacked over the seed crystal under a second condition so that the mixed phase grains grow to fill a space between the mixed phase grains.

According to one embodiment of the present invention, a seed crystal which includes mixed phase grains including an amorphous silicon region and a crystallite which is a microcrystal that can be regarded as a single crystal is formed over an insulating film by a plasma CVD method under a first condition that enables mixed phase grains having high crystallinity and high uniformity of grain sizes to be formed at a low density, and then a microcrystalline semiconductor film is formed to be stacked over the seed crystal by a plasma CVD method under a second condition that enables the mixed phase grains to grow to fill a space between the mixed phase grains.

The first condition that enables mixed phase grains having high crystallinity and high uniformity of grain sizes to be formed at a low density is a condition that the pressure in a process chamber is higher than or equal to 67 Pa and lower than or equal to 13332 Pa and that supply of a source gas under the first condition is performed by alternating supply of a first gas obtained by diluting a deposition gas containing silicon or germanium so that the flow rate of hydrogen is greater than or equal to 50 times and less than or equal to 1000 times that of the deposition gas containing silicon or germanium, and supply of a second gas in which the flow rate of the deposition gas containing silicon or germanium is less than that of the deposition gas containing silicon or germanium of the first gas and is set so as to primarily cause etching of amorphous semiconductor deposited over the insulating film rather than deposition of microcrystalline semiconductor over the insulating film.

The second condition that enables the mixed phase grains to grow to fill a space between the mixed phase grains is a condition that the pressure in a process chamber is higher than or equal to 1333 Pa and lower than or equal to 13332 Pa and that supply of a source gas under the second condition is performed by alternating supply of a third gas obtained by diluting a deposition gas containing silicon or germanium so that the flow rate of hydrogen is greater than or equal to 100 times and less than or equal to 2000 times that of the deposition gas containing silicon or germanium, and supply of a fourth gas in which the flow rate of the deposition gas containing silicon or germanium is less than that of the deposition gas containing silicon or germanium of the third gas and is set so as to primarily cause etching of amorphous semiconductor included in the seed crystal or amorphous semiconductor deposited over the seed crystal rather than deposition of microcrystalline semiconductor over the seed crystal.

Note that the seed crystal is in a state in which mixed phase grains are dispersed. In addition, the mixed phase grains each include an amorphous semiconductor region and a plurality of crystallites that are microcrystals regarded as single crystals. In some cases, the mixed phase grains may include a twin crystal. The power of plasma is preferably selected as appropriate in accordance with the flow rate ratio of hydrogen to the deposition gas containing silicon or germanium.

In one embodiment of the present invention, a second microcrystalline semiconductor film can be formed over the microcrystalline semiconductor film by a plasma CVD method under a third condition, after the microcrystalline semiconductor film is formed under the second condition. The third condition is a condition that a gas containing a deposition gas containing silicon or germanium and hydrogen is used as a source gas supplied to a process chamber, the deposition gas is diluted so that the flow rate ratio of hydrogen to the deposition gas is higher than that in the second condition, and the pressure inside the process chamber is set to be higher than or equal to 1333 Pa and lower than or equal to 13332 Pa.

In one embodiment of the present invention, a second microcrystalline semiconductor film can be formed over the microcrystalline semiconductor film by a plasma CVD method under a third condition, after the microcrystalline semiconductor film is formed under the second condition. The third condition is a condition that the pressure inside the process chamber is set to be higher than or equal to 1333 Pa and lower than or equal to 13332 Pa and that supply of a source gas under the third condition is performed by alternating supply of a gas obtained by diluting a deposition gas containing silicon or germanium so that the flow rate ratio of hydrogen to the deposition gas containing silicon or germanium is higher than that in the second condition, and supply of a gas in which the flow rate of the deposition gas containing silicon or germanium is set so as to primarily cause etching of amorphous semiconductor included in the microcrystalline semiconductor film or amorphous semiconductor deposited over the microcrystalline semiconductor film rather than deposition of microcrystalline semiconductor over the microcrystalline semiconductor film.

Further, in one embodiment of the present invention, a rare gas may be added to the source gas in at least one of the first condition, the second condition, and the third condition.

Another embodiment of the present invention is a method for manufacturing a semiconductor device including a thin film transistor whose channel region is formed using a stack including the seed crystal and the microcrystalline semiconductor film.

Another embodiment of the present invention is a method for manufacturing a photoelectric conversion device in which the stack including the seed crystal and the microcrystalline semiconductor film is used as at least one of a semiconductor film having p-type conductivity, a semiconductor film having n-type conductivity, and a semiconductor film having a function of photoelectric conversion.

According to one embodiment of the present invention, a microcrystalline semiconductor film having high crystallinity and high uniformity of grain sizes of mixed phase grains can be formed. Further, a semiconductor device having small variation and favorable electrical characteristics can be manufactured with high productivity.

DETAILED DESCRIPTION OF THE INVENTION

Figure 1A:
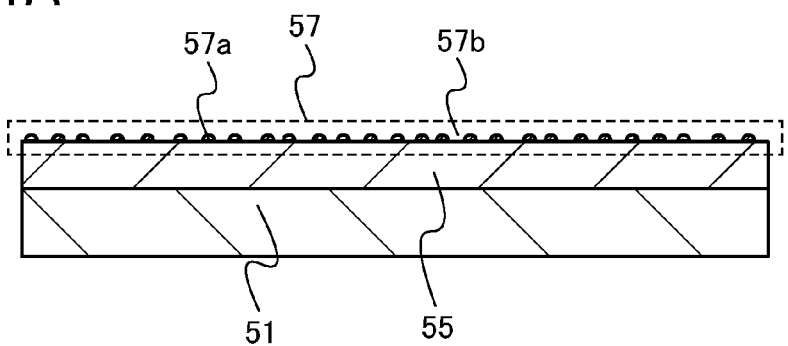
FIGS. 1A and 1B are cross-sectional views illustrating a method for forming a microcrystalline semiconductor film according to one embodiment of the present invention.

Hereinafter, embodiments and an example of the present invention will be described with reference to the drawings.

Note that the present invention is not limited to the following description. It will be readily appreciated by those skilled in the art that the mode and details can be changed in various different ways without departing from the spirit and the scope of the present invention. Therefore, the present invention should not be construed as being limited to the following description of the embodiments and examples. Note that the same reference numerals are commonly used to denote the same components among different drawings.

Embodiment 1

In this embodiment, a method for forming a microcrystalline semiconductor film having high uniformity of grain sizes of mixed phase grains and high crystallinity will be described with reference to FIGS. 1A and 1B and FIG. 2.

As illustrated in FIG. 1A, an insulating film 55 is formed over a substrate 51, and a seed crystal 57 is formed over the insulating film 55.

As the substrate 51, a glass substrate, a ceramic substrate, a plastic substrate which has heat resistance enough to withstand a process temperature of this manufacturing process, or the like can be used. In the case where the substrate does not need a light-transmitting property, a metal substrate, such as a stainless steel substrate, provided with an insulating film on its surface may be used. As the glass substrate, for example, an alkali-free glass substrate of barium borosilicate glass, aluminoborosilicate glass, aluminosilicate glass, or the like may be used. Note that there is no limitation on the size of the substrate 51. For example, any of glass substrates of the 3rd to 10th generations which are often used in the field of the above flat panel displays can be used.

The insulating film 55 can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, or an aluminum nitride oxide film by a CVD method, a sputtering method, or the like.

Note that here, silicon oxynitride contains more oxygen than nitrogen. In the case where measurements are performed using Rutherford backscattering spectrometry (RBS) and hydrogen forward scattering spectrometry (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen. In the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The seed crystal 57 is formed using microcrystalline semiconductor typified by microcrystalline silicon, microcrystalline silicon germanium, microcrystalline germanium, or the like. The seed crystal 57 is in a state in which a plurality of mixed phase grains are dispersed. Thus, the seed crystal 57 has a space 57b between adjacent mixed phase grains 57a without the mixed phase grains 57a being in contact with each other. Further, a feature of the seed crystal 57 is such that the density of the mixed phase grains (the existing proportion of the mixed phase grains in a plane) is low and the uniformity of grain sizes of the mixed phase grains is high. Note that the mixed phase grain includes an amorphous semiconductor region and a crystallite which is a microcrystal that can be regarded as a single crystal. In some cases, the mixed phase grain may include a twin crystal.

The seed crystal 57 is formed in a process chamber of a plasma CVD apparatus by glow discharge plasma using a mixture of hydrogen and a deposition gas containing silicon or germanium, under a first condition that enables mixed phase grains having high uniformity of grain sizes and high crystallinity to be formed at a low density. Alternatively, the seed crystal 57 is formed by glow discharge plasma using a mixture of hydrogen, a deposition gas containing silicon or germanium, and a rare gas such as helium, argon, neon, krypton, or xenon. Here, microcrystalline silicon, microcrystalline silicon germanium, microcrystalline germanium, or the like is formed under the first condition that the pressure in the process chamber is higher than or equal to 67 Pa and lower than or equal to 13332 Pa (higher than or equal to 0.5 Torr and lower than or equal to 100 Torr) and that supply of a source gas is performed by alternating supply of a first gas obtained by diluting a deposition gas containing silicon or germanium so that the flow rate of hydrogen is greater than or equal to 50 times and less than or equal to 1000 times that of the deposition gas, and supply of a second gas in which the flow rate of the deposition gas is less than that of the deposition gas of the first gas and is set so as to primarily cause etching of amorphous semiconductor deposited over the insulating film rather than deposition of microcrystalline semiconductor over the insulating film. That is, the supplying method of the source gas under the first condition is a method in which the flow rate ratio of the deposition gas containing silicon or germanium to hydrogen is alternately changed during generation of plasma by glow discharge. "To alternately change the flow rate ratio of the deposition gas containing silicon or germanium to hydrogen" means periodically increasing and decreasing the flow rate of the deposition gas containing silicon or germanium or the flow rate of hydrogen.

For example, in the supplying method of the source gas under the first condition, the flow rate of the deposition gas containing silicon or germanium is changed to alternate between high and low flow rates with the flow rate of hydrogen fixed during generation of plasma by glow discharge. When the flow rate of the deposition gas containing silicon or germanium is high, for example, when the flow rate of hydrogen is set to be greater than or equal to 50 times and less than or equal to 1000 times that of the deposition gas, deposition of microcrystalline semiconductor over the insulating film is primarily caused. On the other hand, when the flow rate of the deposition gas containing silicon or germanium is low, etching of amorphous semiconductor deposited over the insulating film is primarily caused rather than deposition of microcrystalline semiconductor over the insulating film.

At this time, the deposition temperature is preferably room temperature to 300° C., further preferably 150° C. to 280° C. The distance between an upper electrode and a lower electrode in the process chamber is set to a distance that enables generation of plasma. With the first condition, crystal growth is promoted and the uniformity of grain sizes of the mixed phase grains 57a in the seed crystal 57 is improved. In addition, the size of the crystallite included in the mixed phase grain 57a in the seed crystal 57 is increased. Further, the space 57b is formed between the adjacent mixed phase grains 57a, which leads to a low density of the mixed phase grains 57a.

As typical examples of the deposition gas containing silicon or germanium, there are $SiH_4$, $Si_2H_6$, $GeH_4$, $Ge_2H_6$, and the like.

When a rare gas such as helium, argon, neon, krypton, or xenon is added to the source gas of the seed crystal 57, the deposition rate of the seed crystal 57 is increased, which can reduce the amount of impurities mixed in the seed crystal 57. Accordingly, the crystallinity of the seed crystal 57 can be improved. By adding a rare gas such as helium, argon, neon, krypton, or xenon to the source gas of the seed crystal 57, stable plasma generation is possible without application of high power. Therefore, plasma damage to the seed crystal 57 can be reduced and the crystallinity of the seed crystal 57 can be improved.

When the seed crystal 57 is formed, glow discharge plasma is generated by application of high-frequency power with a frequency of 3 MHz to 30 MHz, typically 13.56 MHz or 27.12 MHz in the HF band, or high-frequency power with a frequency of approximately 30 MHz to 300 MHz in the VHF band, typically 60 MHz. Alternatively, glow discharge plasma is generated by application of high-frequency power with a microwave of 1 GHz or higher. Note that pulsed oscillation by which high-frequency power is applied in a pulsed manner or continuous oscillation by which high-frequency power is applied continuously can be employed. In addition, by superimposing high-frequency power in the HF band and high-frequency power in the VHF band on each other, unevenness of plasma across a large-sized substrate is also reduced, so that uniformity can be increased and the deposition rate can be increased.

Here, the supplying method of the source gas under the first condition will be described with reference to FIG. 2, where supply of a first gas obtained by diluting a deposition gas containing silicon or germanium so that the flow rate of hydrogen is greater than or equal to 50 times and less than or equal to 1000 times that of the deposition gas, and supply of a second gas in which the flow rate of the deposition gas is less than that of the deposition gas of the first gas and is set so as to primarily cause etching of amorphous semiconductor deposited over the insulating film rather than deposition of microcrystalline semiconductor over the insulating film are alternately performed.

Figure 2:
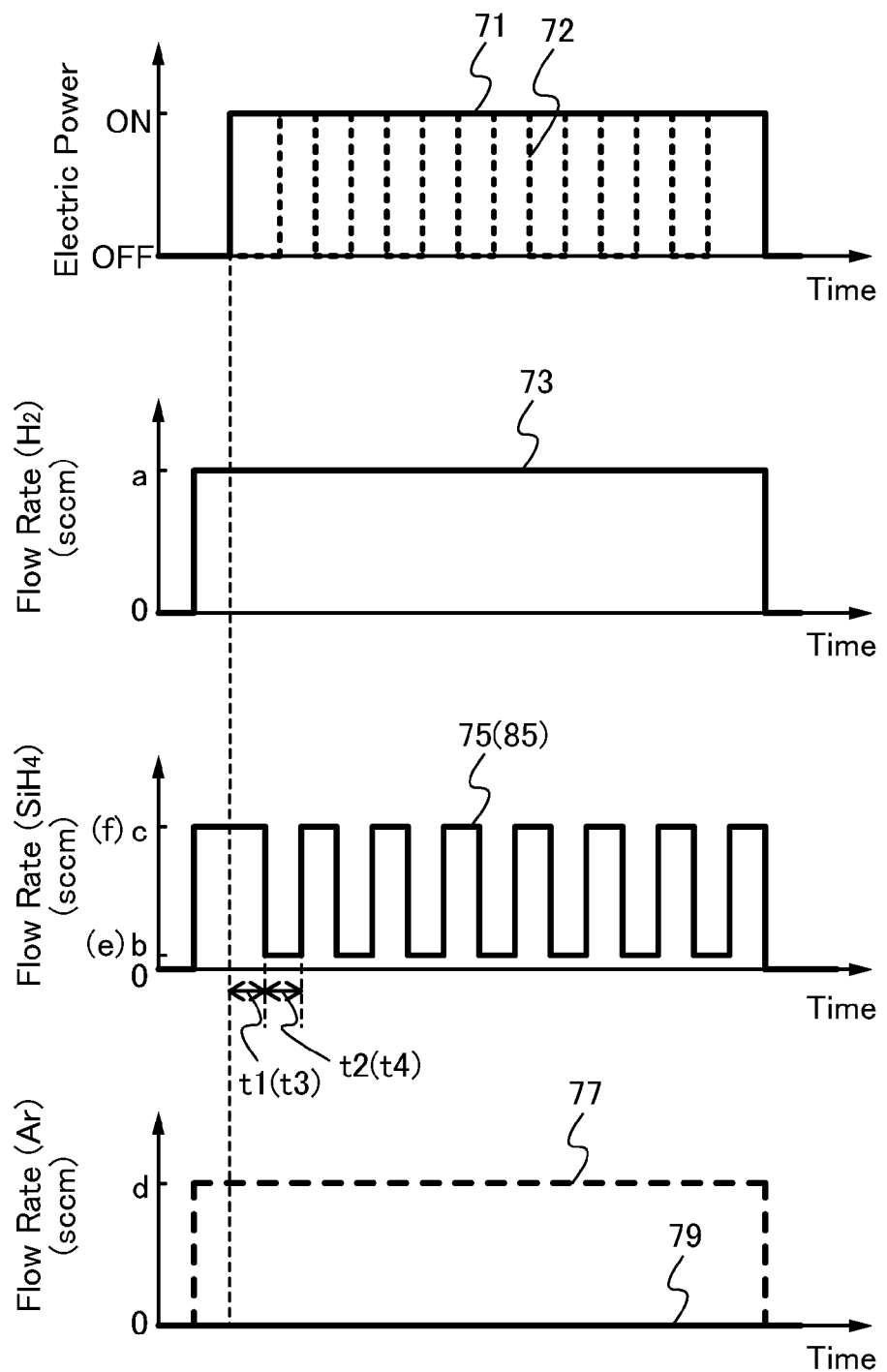
FIG. 2 is a diagram showing a method for forming a microcrystalline semiconductor film according to one embodiment of the present invention.

FIG. 2 is a timing chart showing temporal changes of the source gas and the power supplied to an apparatus in the method for forming a seed crystal described in this embodiment. In FIG. 2, a solid line 71 indicates on/off states of power supply of the plasma CVD apparatus, a solid line 73 indicates the flow rate of hydrogen, a solid line 75 indicates the flow rate of the deposition gas containing silicon or germanium (silane is used in FIG. 2), and a solid line 79 indicates the flow rate of a rare gas (argon is used in FIG. 2).

The deposition gas containing silicon or germanium, which is a source gas, and hydrogen are introduced into the process chamber of the plasma CVD apparatus and the pressure therein is set at a predetermined level. The temperature of the substrate 51 is set at a predetermined temperature. At this time, hydrogen is introduced into the process chamber with a fixed flow rate (flow rate a in FIG. 2).

Next, high-frequency power supply is turned on, and plasma discharge is performed. The deposition gas containing silicon or germanium whose flow rate is alternately increased and decreased is supplied into the process chamber. Here, alternately increasing and decreasing the flow rate ratio of the deposition gas containing silicon or germanium to hydrogen is called cycle flow. In this embodiment, after the power supply is turned on, a first period in which the deposition gas containing silicon or germanium with a flow rate c, which is a high flow rate, is supplied for $t_1$ seconds and a second period in which the deposition gas containing silicon or germanium with a flow rate b (b<c), which is a low flow rate, is supplied for $t_2$ seconds are repeated. Note that the flow rate of the deposition gas containing silicon or germanium in the second period is lower than that in the first period, so that the flow rate ratio of hydrogen to the deposition gas containing silicon or germanium in the second period is higher than that in the first period. In the first period, in the case where the flow rate of hydrogen is made more than or equal to 50 times and less than or equal to 1000 times that of the deposition gas, generation of microcrystalline semiconductor is primarily caused by plasma discharge performed later rather than generation of amorphous semiconductor. In the second period, etching of the amorphous semiconductor deposited over the insulating film is primarily caused rather than the deposition of microcrystalline semiconductor over the insulating film.

Note that the high-frequency power supply may be turned on and off repeatedly as shown by a dashed line 72.

In the second period in which the flow rate of the deposition gas containing silicon or germanium is lower than that in the first period (the period with the flow rate b in FIG. 2), the amorphous semiconductor deposited over the insulating film is selectively etched by hydrogen radicals dissociated in plasma. Thus, generation of a new seed crystal between mixed phase grains of the seed crystal can be reduced, so that mixed phase grains with uniform grain size can be formed. Note that the radicals (typically, silyl radicals) are slightly generated from the deposition gas containing silicon or germanium, and are bonded to dangling bonds of the microcrystalline semiconductor on the deposition surface; thus, a seed crystal with high crystallinity is formed. That is, crystal growth occurs concurrently with selective etching, whereby the crystallinity of the seed crystal is increased.

Note that in the second period, only hydrogen may be introduced into the process chamber without introducing the deposition gas containing silicon or germanium into the process chamber.

In the first period in which the flow rate of the deposition gas containing silicon or germanium is high (the period with the flow rate c in FIG. 2), a large number of radicals are generated from the deposition gas containing silicon or germanium as compared to the second period with the flow rate b, so that the crystal growth occurs. The seed crystal includes a plurality of mixed phase grains, and the size of the crystallites in the mixed phase grains can be increased by the method for forming the seed crystal, which is described in this embodiment; thus, the crystallinity of the seed crystal can be increased. Further, defects in the seed crystal are reduced.

Note that here, after the first period in which the deposition gas containing silicon or germanium flows with the flow rate c, the second period in which the deposition gas containing silicon or germanium flows with the flow rate b follows; however, after the second period in which the deposition gas containing silicon or germanium flows with the flow rate b, the first period in which the deposition gas containing silicon or germanium flows with the flow rate c may follow. Further, the length of $t_1$ and that of $t_2$ may be the same as or different from each other. Note that $t_1$ and $t_2$ are each preferably several seconds to several tens of seconds. When the first period ($t_1$) and the second period ($t_2$) are each several minutes, for example, a seed crystal having low crystallinity with several nanometers of grain size is formed in the first period ($t_1$), and only a surface of the seed crystal is reacted in the second period ($t_2$). Accordingly, it is difficult to increase the crystallinity inside the seed crystal.

Note that here, each of all the first periods, i.e., each of all periods in which the deposition gas containing silicon or germanium flows with the flow rate c, takes $t_1$ seconds, each of all the second periods, i.e., each of all periods in which the deposition gas containing silicon or germanium flows with the flow rate b (b<c), takes $t_2$ seconds, and the first period and the second period are periodically alternated. However, the first periods may take different times and the second periods may also take different times.

Further, as shown by the solid line 79 in FIG. 2, a rare gas such as helium, argon, neon, krypton, or xenon is not introduced; however, as shown by a dashed line 77, the rare gas may be introduced into the process chamber at a flow rate of d sccm. Alternatively, a rare gas whose flow rate is periodically increased and decreased may be introduced into the process chamber.

Note that although the flow rate of hydrogen is fixed and the flow rate of the deposition gas containing silicon or germanium is alternately changed in the cycle flow here, the flow rate of hydrogen may be changed within the amount range of hydrogen needed for forming the microcrystalline semiconductor. Alternatively, the flow rate of the deposition gas containing silicon or germanium may be fixed and the flow rate of hydrogen may be periodically increased and decreased.

By changing the flow rate of the source gas while the high-frequency power supply is kept on, the deposition rate of the seed crystal can be improved.

Note that after the deposition gas containing silicon or germanium is introduced into the process chamber with the flow rate c, that is, after the first period, the high-frequency power supply may be turned off. Alternatively, after the deposition gas containing silicon or germanium is introduced into the process chamber with the flow rate b, that is, after the second period, the high-frequency power supply may be turned off.

Note that before the seed crystal 57 is formed, a deposition gas containing silicon or germanium may be introduced into the process chamber of the CVD apparatus while the gas in the process chamber is removed so that impurity elements in the process chamber can be removed. Thus, the amount of impurities in the seed crystal 57 can be reduced. Further, the seed crystal 57 can be formed to be dense in such a manner that, before the seed crystal 57 is formed, plasma is generated in an atmosphere containing fluorine such as a fluorine atmosphere, a nitrogen fluoride atmosphere, or a silane fluoride atmosphere, and the insulating film 55 is exposed to the fluorine plasma.

Figure 1B:
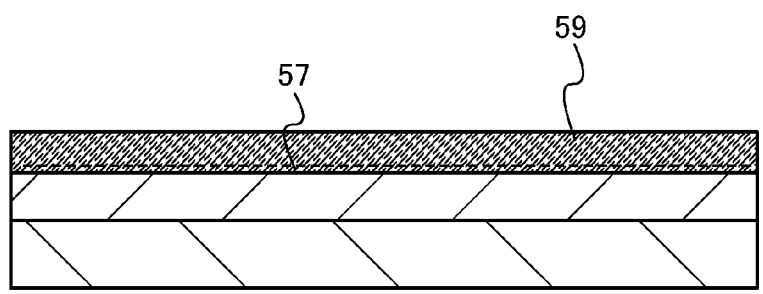

Then, as illustrated in FIG. 1B, a microcrystalline semiconductor film 59 is formed over the seed crystal 57. The microcrystalline semiconductor film 59 is formed under a condition that enables crystallites of the seed crystal 57 to grow so that the space between the mixed phase grains is filled.

The microcrystalline semiconductor film 59 is formed under a second condition in a process chamber of the plasma CVD apparatus by glow discharge plasma using a mixture of hydrogen and a deposition gas containing silicon or germanium. Alternatively, the microcrystalline semiconductor film 59 may be formed under a second condition by glow discharge plasma using a mixture of hydrogen, a rare gas such as helium, argon, neon, krypton, or xenon, and a deposition gas containing silicon or germanium. Here, the second condition is a condition that the pressure in a process chamber is higher than or equal to 1333 Pa and lower than or equal to 13332 Pa (higher than or equal to 10 Torr and lower than or equal to 100 Torr) and that supply of a source gas under the second condition is performed by alternating supply of a third gas obtained by diluting the deposition gas containing silicon or germanium so that the flow rate of hydrogen is greater than or equal to 100 times and less than or equal to 2000 times that of the deposition gas, and supply of a fourth gas in which the flow rate of the deposition gas containing silicon or germanium is less than that of the deposition gas of the third gas and is set so as to primarily cause etching of amorphous semiconductor included in the seed crystal or amorphous semiconductor deposited over the seed crystal rather than deposition of microcrystalline semiconductor over the seed crystal. That is, the supplying method of the source gas under the second condition is characterized by alternately changing the flow rate ratio of the deposition gas containing silicon or germanium to hydrogen during generation of plasma by glow discharge. "Alternately changing the flow rate ratio of the deposition gas containing silicon or germanium to hydrogen" refers to periodically increasing and decreasing the flow rate of the deposition gas containing silicon or germanium or the flow rate of hydrogen.

For example, the supplying method of the source gas under the second condition is a method in which the flow rate of hydrogen is fixed and the flow rate of the deposition gas containing silicon or germanium is changed to alternate between high and low flow rates during generation of plasma by glow discharge. When the flow rate of the deposition gas containing silicon or germanium is high, typically when the flow rate of hydrogen is greater than or equal to 100 times and less than or equal to 2000 times that of the deposition gas, crystal growth of microcrystalline semiconductor over the seed crystal is primarily caused. On the other hand, when the flow rate of the deposition gas containing silicon or germanium is low, etching of amorphous semiconductor included in the seed crystal or amorphous semiconductor deposited over the seed crystal is primarily caused.

Microcrystalline silicon, microcrystalline silicon germanium, microcrystalline germanium, or the like is formed under the above second condition. Therefore, in the microcrystalline semiconductor film 59, the ratio of the crystal regions to the amorphous semiconductor is increased and the space between the crystal regions is reduced, whereby the crystallinity is improved.

The deposition temperature at this time is preferably from room temperature to 300° C., and further preferably 150° C. to 280° C. The distance between an upper electrode and a lower electrode in the process chamber may be set to a distance which enables generation of plasma.

The condition for generating glow discharge plasma in the formation of the seed crystal 57 can be employed as appropriate for the formation of the microcrystalline semiconductor film 59. In the case where the condition for generating glow discharge plasma in the formation of the seed crystal 57 and that in the formation of the microcrystalline semiconductor film 59 are the same, throughput can be increased. However, the conditions may be different from each other.

The supplying method of the source gas under the second condition will be described below, where during generation of plasma by glow discharge, supply of a third gas obtained by diluting a deposition gas containing silicon or germanium so that the flow rate of hydrogen is greater than or equal to 100 times and less than or equal to 2000 times that of the deposition gas, and supply of a fourth gas in which the flow rate of the deposition gas containing silicon or germanium is less than that of the deposition gas of the third gas and is set so as to primarily cause etching of amorphous semiconductor included in the seed crystal or amorphous semiconductor deposited over the seed crystal rather than deposition of microcrystalline semiconductor over the seed crystal, are alternately performed. Note that in FIG. 2, reference signs regarding the second condition are shown in parentheses.

Also in the second condition, in a manner similar to that of the first condition for forming the seed crystal, cycle flow in which the flow rate ratio of the deposition gas containing silicon or germanium to hydrogen is alternately increased and decreased as shown in FIG. 2 is performed. Specifically, as shown by a solid line 85, after the power supply is turned on, a first period in which the deposition gas containing silicon or germanium with a flow rate f, which is a high flow rate, is supplied for $t_3$ seconds and a second period in which the deposition gas containing silicon or germanium with a flow rate e (e<f), which is a low flow rate, is supplied for $t_4$ seconds are repeated. The on/off of the high-frequency power supply and the method for introducing hydrogen and a rare gas into the process chamber may be similar to those of the first condition. In this case, the flow rate of hydrogen and the flow rate of a rare gas may be similar to or different from those of the first condition. In the first period, in the case where the flow rate of hydrogen is made more than or equal to 100 times and less than or equal to 2000 times that of the deposition gas, crystal growth of the microcrystalline semiconductor over the seed crystal is primarily caused by plasma discharge performed later. In the second period, etching of amorphous semiconductor included in the seed crystal or amorphous semiconductor deposited over the seed crystal is primarily caused.

Radicals are generated from the deposition gas containing silicon or germanium along with hydrogen radicals in plasma. When the pressure in the process chamber is set higher than or equal to 1333 Pa and lower than or equal to 13332 Pa (higher than or equal to 10 Torr and lower than or equal to 100 Torr), the mean free path of the deposition gas is short because of such high pressure in the process chamber; thus, hydrogen radicals and hydrogen plasma ions lost energy every time they collide with each other. Accordingly, the energy of ions when they reach the seed crystal 57 is low. Therefore, not the etching but the crystal growth is primarily promoted between mixed phase grains in the seed crystal 57, and a microcrystalline semiconductor is deposited; thus, the space between the crystal regions is reduced and the density of the microcrystalline semiconductor film is increased. When the pressure in the process chamber is set to the above-described level, the energy of the ions becomes low, so that plasma damage to the microcrystalline semiconductor film is reduced. Thus, defects are reduced.

In the second period in which the flow rate of the deposition gas containing silicon or germanium is low (the period with the flow rate e in FIG. 2), when the pressure in the process chamber is set higher than or equal to 1333 Pa and lower than or equal to 13332 Pa (higher than or equal to 10 Torr and lower than or equal to 100 Torr), the amorphous semiconductor included in the seed crystal 57 which is formed under the first condition or the amorphous semiconductor deposited over the seed crystal 57 are selectively etched by hydrogen radicals dissociated in plasma because of such high pressure in the process chamber. Note that the radicals (typically, silyl radicals) are slightly generated from the deposition gas containing silicon or germanium, and are bonded to dangling bonds of the microcrystalline semiconductor on the deposition surface; thus, crystals with high crystallinity grow. That is, crystal growth occurs concurrently with the selective etching, whereby the crystallinity of the microcrystalline semiconductor film is increased.

Note that in the second period, only hydrogen may be introduced into the process chamber without introducing the deposition gas containing silicon or germanium into the process chamber.

In the first period in which the flow rate of the deposition gas containing silicon or germanium is high (the period with the flow rate f in FIG. 2), a large number of radicals are generated from the deposition gas containing silicon or germanium as compared to the second period with the flow rate e, so that the crystal growth occurs. The microcrystalline semiconductor film includes a plurality of mixed phase grains, and the size of the crystallites in the mixed phase grains can be increased by the method for forming the microcrystalline semiconductor film which is described in this embodiment; thus, the crystallinity of the microcrystalline semiconductor film can be improved. Further, defects in the microcrystalline semiconductor film 59 are reduced.

By newly generating the mixed phase grains of the microcrystalline semiconductor film in spaces between the mixed phase grains of the seed crystal, the size of the mixed phase grains is reduced. Therefore, it is preferable that the frequency of generation of the mixed phase grains of the microcrystalline semiconductor film be lower than that of the mixed phase grains of the seed crystal. In this manner, crystal growth from the seed crystal can be promoted primarily.

In the first period, crystal growth occurs using the seed crystal having high uniformity of grain sizes as a nucleus; accordingly, the uniformity of grain sizes of the mixed phase grains of the microcrystalline semiconductor film is also increased.

In the same way as the first condition, after the second period in which the deposition gas containing silicon or germanium flows with the flow rate e, the first period in which the deposition gas containing silicon or germanium flows with the flow rate f may follow. The lengths of the first period ($t_3$) and that of the second period ($t_4$) may be the same as or different from each other. Note that the first period ($t_3$) and the second period ($t_4$) are each preferably several seconds to several tens of seconds in the same way as the first condition.

Note that here, each of all the first periods, i.e., each of all periods in which the deposition gas containing silicon or germanium flows with the flow rate f, takes $t_3$ seconds, each of all the second periods, i.e., each of all periods in which the deposition gas containing silicon or germanium flows with the flow rate e, takes $t_4$ seconds, and the first period and the second period are periodically alternated. However, the first periods may take different times and the second periods may also take different times.

Note that after the deposition gas containing silicon or germanium is introduced into the process chamber with the flow rate f, that is, after the first period, the high-frequency power supply may be turned off. Alternatively, after the deposition gas containing silicon or germanium is introduced into the process chamber with the flow rate e, that is, after the second period, the high-frequency power supply may be turned off.

Further, the first period ($t_1$) under the first condition and the first period ($t_3$) under the second condition may be the same as or different from each other. Furthermore, the second period ($t_2$) in the first condition and the second period ($t_4$) in the second condition may be the same as or different from each other.

Through the above-described process, a microcrystalline semiconductor film having high crystallinity and high uniformity of grain sizes of mixed phase grains can be formed.

The thickness of the seed crystal 57 is preferably more than or equal to 1 nm and less than or equal to 10 nm. If the thickness of the seed crystal 57 is more than 10 nm, even when the microcrystalline semiconductor film 59 is deposited, it is difficult to fill the space between the mixed phase grains and to etch the amorphous semiconductor included in the seed crystal 57, which leads to reduction in the crystallinity of the seed crystal 57 and the microcrystalline semiconductor film 59. In addition, since the mixed phase grain needs to be formed in the seed crystal 57, the thickness of the seed crystal 57 is preferably more than or equal to 1 nm.

The seed crystal 57 and the microcrystalline semiconductor film 59 include a microcrystalline semiconductor. Note that a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which columnar or needle-like mixed phase grains having a diameter greater than or equal to 2 nm and less than or equal to 200 nm, preferably greater than or equal to 10 nm and less than or equal to 80 nm, further preferably greater than or equal to 20 nm and less than or equal to 50 nm grow in a direction normal to the substrate surface. Therefore, there is a case in which a crystal grain boundary is formed at the interface between the columnar or needle-like mixed phase grains. Note that the diameter of crystal grains means the maximum diameter of crystal grains in a plane parallel to the substrate surface.

The Raman spectrum of microcrystalline silicon, which is a typical example of a microcrystalline semiconductor, is located in a lower wave number side than 520 $cm^{-1}$, which represents single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon includes hydrogen or halogen at 1 atomic % or more in order to terminate dangling bonds. Moreover, microcrystalline silicon has increased stability and is preferable when containing a rare gas element such as helium, argon, neon, krypton, or xenon to further enhance lattice distortion. Such a description of the microcrystalline semiconductor is disclosed in, for example, U.S. Pat. No. 4,409,134.

According to this embodiment, a microcrystalline semiconductor film having high crystallinity and high uniformity of grain sizes of mixed phase grains by reduction of a space between the mixed phase grains can be formed.

Embodiment 2

In this embodiment, a method for forming a microcrystalline semiconductor film having higher crystallinity than the microcrystalline semiconductor film in Embodiment 1 will be described with reference to FIGS. 1A and 1B and FIG. 3.

As in Embodiment 1, the seed crystal 57 and the microcrystalline semiconductor film 59 are formed through the process of FIGS. 1A and 1B.

Figure 3:
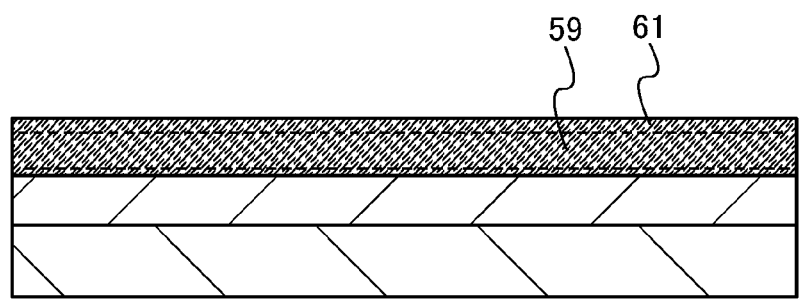
FIG. 3 is a cross-sectional view illustrating a method for forming a microcrystalline semiconductor film according to one embodiment of the present invention.

Next, as illustrated in FIG. 3, a second microcrystalline semiconductor film 61 is formed over the microcrystalline semiconductor film 59.

The second microcrystalline semiconductor film 61 is formed in a process chamber of the plasma CVD apparatus, using glow discharge plasma with the use of a mixture of hydrogen and a deposition gas containing silicon or germanium under a third condition. Alternatively, the second microcrystalline semiconductor film 61 may be formed using glow discharge plasma with the use of a mixture of hydrogen, a deposition gas containing silicon or germanium, and a rare gas such as helium, argon, neon, krypton, or xenon under the third condition. Here, as the second microcrystalline semiconductor film 61, microcrystalline silicon, microcrystalline silicon germanium, microcrystalline germanium, or the like is formed under the third condition that the deposition gas is diluted so that the flow rate ratio of hydrogen to the deposition gas containing silicon or germanium is higher than that in the second condition, and that the pressure in the process chamber is higher than or equal to 1333 Pa and lower than or equal to 13332 Pa (higher than or equal to 10 Torr and lower than or equal to 100 Torr) similarly to that in the second condition. The deposition temperature at this time is preferably room temperature to 300° C., further preferably 150° C. to 280° C.

Here, the third condition may be a condition similar to the second condition, that is, a condition that the pressure in the process chamber is higher than or equal to 1333 Pa and lower than or equal to 13332 Pa and that supply of a source gas is performed by alternating supply of a fifth gas obtained by diluting a deposition gas containing silicon or germanium so that the flow rate ratio of hydrogen to the deposition gas is higher than that in the second condition, and supply of a sixth gas in which the flow rate of the deposition gas containing silicon or germanium is less than that of the deposition gas of the fifth gas and is set so as to primarily cause etching of amorphous semiconductor included in the microcrystalline semiconductor film 59 or amorphous semiconductor deposited over the microcrystalline semiconductor film 59 rather than deposition of microcrystalline semiconductor over the microcrystalline semiconductor film 59. As a result, the crystallinity of the second microcrystalline semiconductor film 61 can be further increased.

By setting the flow rate ratio of hydrogen to the deposition gas containing silicon or germanium to be higher than that in the second condition, the crystallinity of the second microcrystalline semiconductor film 61 can be further increased; in such a manner, a microcrystalline semiconductor film whose surface crystallinity is higher than that of the microcrystalline semiconductor film in Embodiment 1 can be formed.

Embodiment 3

In this embodiment, a method for manufacturing a thin film transistor formed in a semiconductor device that is one embodiment of the present invention will be described with reference to FIGS. 4A to 4D, FIGS. 5A and 5B, FIGS. 6A to 6C, and FIGS. 7A to 7D. Note that an n-channel thin film transistor has higher carrier mobility than a p-channel thin film transistor. Further, it is preferable that all thin film transistors formed over the same substrate have the same polarity because the number of manufacturing steps can be reduced in such a case. In this embodiment, a method for manufacturing n-channel thin film transistors will be described.

Note that the term "on-state current" refers to current which flows between a source electrode and a drain electrode when a thin film transistor is on. For example, in the case of an n-channel thin film transistor, the on-state current refers to current which flows between a source electrode and a drain electrode when gate voltage is higher than the threshold voltage of the transistor.

In addition, the term "off-state current" refers to current which flows between a source electrode and a drain electrode when a thin film transistor is off. For example, in the case of an n-channel thin film transistor, the off-state current refers to current which flows between a source electrode and a drain electrode when gate voltage is lower than the threshold voltage of the thin film transistor.

Figure 4A:
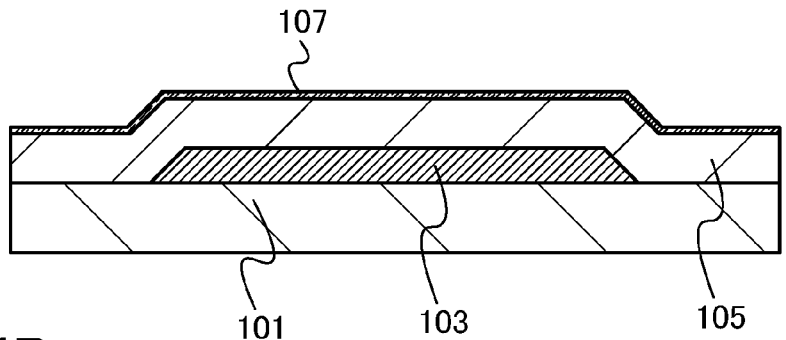
FIGS. 4A to 4D are cross-sectional views illustrating a method for manufacturing a semiconductor device according to one embodiment of the present invention.

As illustrated in FIG. 4A, a gate electrode 103 is formed over a substrate 101. Then, a gate insulating film 105 which covers the gate electrode 103 (also referred to as a first gate electrode) is formed. A seed crystal 107 is formed over the gate insulating film 105.

As the substrate 101, any of the substrates that can be used as the substrate 51 described in Embodiment 1 can be used as appropriate.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these material materials as a main component. Further, a semiconductor typified by polycrystalline silicon doped with an impurity element such as phosphorus, an Ag—Pd—Cu alloy, an Al—Nd alloy, an Al—Ni alloy, or the like may be used.

The following are preferable examples of the two-layer structure of the gate electrode 103: a two-layer structure in which a molybdenum film is provided over an aluminum film, a two-layer structure in which a molybdenum film is provided over a copper film, a two-layer structure in which a titanium nitride film or a tantalum nitride film is provided over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film serving as a barrier film over a film having low electric resistance, electric resistance of the gate electrode 103 can be low and diffusion of metal elements from the metal film into the semiconductor film can be prevented.

The gate electrode 103 can be formed in the following manner: a conductive film is formed over the substrate 101 by a sputtering method or a vacuum evaporation method using any of the above materials; a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a nitride film of any of the above metal materials may be provided between the substrate 101 and the gate electrode 103. In this embodiment, a conductive film is formed over the substrate 101 and etched using a resist mask formed by a photolithography method.

Note that a side surface of the gate electrode 103 preferably has a tapered shape. This is because an insulating film, a semiconductor film, and a wiring formed over the gate electrode 103 in later steps can be prevented from being cut at a step portion of the gate electrode 103. In order to form the gate electrode 103 to have a tapered shape, etching may be performed while the resist mask is made to recede.

In the step of forming the gate electrode 103, a gate wiring (a scan line) and a capacitor wiring can also be formed at the same time. The scan line refers to a wiring for selecting a pixel, and the capacitor wiring refers to a wiring which is connected to one of electrodes of a storage capacitor in a pixel. However, without limitation thereto, the gate electrode 103 and one of or both the gate wiring and the capacitor wiring may be formed separately.

The gate insulating film 105 can be formed using any of the insulating films that can be used as the insulating film 55 described in Embodiment 1 as appropriate. By forming the gate insulating film 105 using an oxide insulating film such as a silicon oxide film or a silicon oxynitride film, fluctuation in threshold voltage of the thin film transistor can be reduced. Further, in the case where a silicon nitride film or a silicon nitride oxide film is formed as the gate insulating film 105, oxidation treatment on a surface of the gate insulating film 105 can reduce fluctuation in the threshold voltage of the thin film transistor. As the oxidation treatment on the surface of the gate insulating film 105, there is a method in which the gate insulating film 105 is exposed to plasma that is generated in an oxidizing gas atmosphere such as oxygen, ozone, dinitrogen monoxide, water vapor, or a mixed gas of oxygen and hydrogen.

The gate insulating film 105 can be formed by a CVD method, a sputtering method, or the like. The condition for the deposition of the seed crystal 57 which is described in Embodiment 1 can be employed as appropriate to generate the glow discharge plasma in the step of forming the gate insulating film 105 by a CVD method. When the gate insulating film 105 is formed at a high frequency of 1 GHz or more with a microwave plasma CVD apparatus, the breakdown voltage between the gate electrode and the drain and source electrodes can be improved, whereby a highly reliable thin film transistor can be obtained.

Further, by forming a silicon oxide film by a CVD method using an organosilane gas as the gate insulating film 105, the crystallinity of the semiconductor film which is formed later can be increased, whereby the on-state current and the field-effect mobility of the thin film transistor can be increased. Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

The seed crystal 107 can be formed under the first condition that enables the mixed phase grains having high uniformity of grain sizes and high crystallinity to be formed at a low density, in a manner similar to that of the seed crystal 57 described in Embodiment 1.

In the case where a rare gas such as helium, neon, argon, krypton, or xenon is added to the source gas of the seed crystal 107, the crystallinity of the seed crystal 107 can be increased. Accordingly, the on-state current and the field-effect mobility of the thin film transistor can be increased and the throughput of the thin film transistor can also be increased.

Figure 4B:
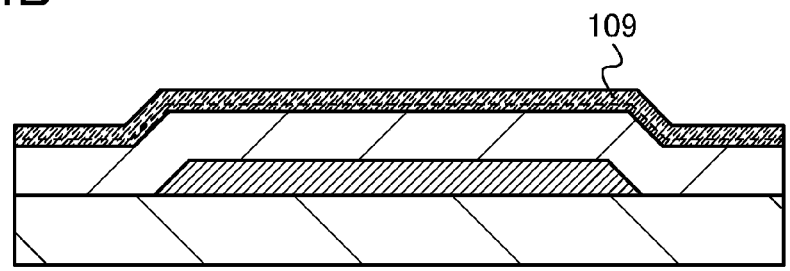

Then, as illustrated in FIG. 4B, a microcrystalline semiconductor film 109 is formed over the seed crystal 107. In a manner similarly to that of the microcrystalline semiconductor film 59 described in Embodiment 1, the microcrystalline semiconductor film 109 can be formed under the second condition that enables the mixed phase grains in the seed crystal 107 to grow to fill a space between the mixed phase grains. As a result, a microcrystalline semiconductor film having high crystallinity and high uniformity of grain sizes of mixed phase grains can be formed.

Note that the thickness of the microcrystalline semiconductor film 109 is preferably greater than or equal to 30 nm and less than or equal to 100 nm. The reason for this is as follows: when the microcrystalline semiconductor film 59 has a thickness of 30 nm or more, variation in electrical characteristics of thin film transistors can be reduced; and when the microcrystalline semiconductor film 109 has a thickness of 100 nm or less, throughput can be increased and film peeling due to stress can be suppressed.

In the case where a rare gas such as helium, argon, neon, krypton, or xenon is added to the source gas of the microcrystalline semiconductor film 109, the crystallinity of the microcrystalline semiconductor film 109 can be improved as in the case of the seed crystal 107. Accordingly, the on-state current and the field-effect mobility of the thin film transistor can be increased and the throughput of the thin film transistor can also be increased.

Figure 4C:
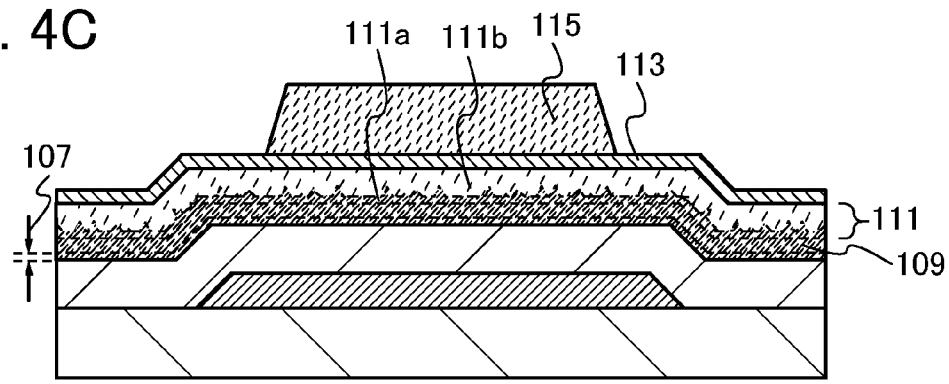
Figure 4D:
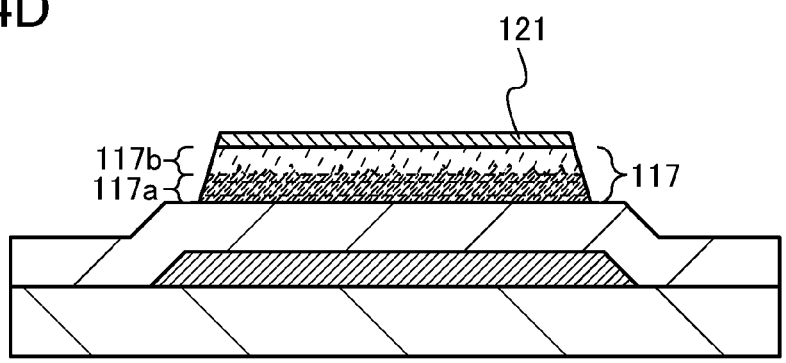

Then, as illustrated in FIG. 4C, a semiconductor film 111 is formed over the microcrystalline semiconductor film 109. The semiconductor film 111 includes a microcrystalline semiconductor region 111a and an amorphous semiconductor region 111b. Then, an impurity semiconductor film 113 is formed over the semiconductor film 111. Then, a mask 115 is formed of a resist over the impurity semiconductor film 113.

The semiconductor film 111 including the microcrystalline semiconductor region 111a and the amorphous semiconductor region 111b can be formed under a condition which causes partial crystal growth using the microcrystalline semiconductor film 109 as a seed crystal (a condition under which the crystal growth is suppressed).

The semiconductor film 111 is formed in a process chamber of a plasma CVD apparatus by glow discharge plasma using a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the seed crystal 107.

In this case, the flow rate ratio of hydrogen to the deposition gas containing silicon or germanium is set so that the flow rate of hydrogen is greater than or equal to 50 times and less than or equal to 2000 times that of the deposition gas in order to form a microcrystalline semiconductor as in the case of forming the seed crystal 107 or the microcrystalline semiconductor film 109, and a gas containing nitrogen is used as a source gas, whereby crystal growth can be suppressed as compared to the deposition conditions for the seed crystal 107 and the microcrystalline semiconductor film 109. Specifically, since a gas containing nitrogen is included in the source gas, the crystal growth is partly suppressed at an early stage of the deposition of the semiconductor film 111; thus, a conical or pyramidal microcrystalline semiconductor region grows, and an amorphous semiconductor region is formed. Furthermore, at a middle stage or later stage of the deposition, the crystal growth of the conical or pyramidal microcrystalline semiconductor region stops, and only an amorphous semiconductor region is deposited. As a result, in the semiconductor film 111, the microcrystalline semiconductor region 111a and the amorphous semiconductor region 111b which is formed using a well-ordered semiconductor film having fewer defects and a steep tail of a level at a band edge in the valence band, can be formed.

Here, a typical example of a condition for forming the semiconductor film 111 is a condition in which the flow rate of hydrogen is 10 times to 2000 times, preferably 10 times to 200 times that of the deposition gas containing silicon or germanium. Note that in a typical example of a condition for forming a normal amorphous semiconductor film, the flow rate of hydrogen is 0 times to 5 times that of the deposition gas containing silicon or germanium.

By introducing a rare gas such as helium, argon, neon, xenon, or krypton into a source gas of the semiconductor film 111, the deposition rate can be increased.

The thickness of the semiconductor film 111 is preferably 50 nm to 350 nm, further preferably 120 nm to 250 nm.

Figure 5A:
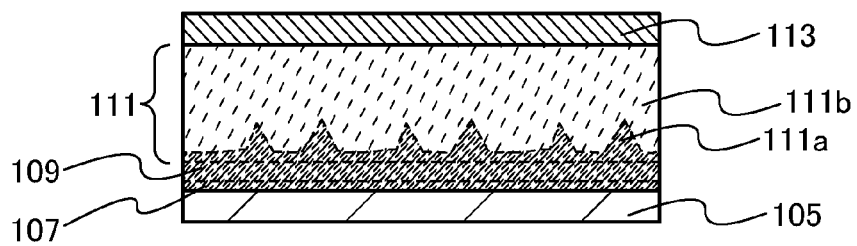
FIGS. 5A and 5B are cross-sectional views illustrating a method for manufacturing a semiconductor device according to one embodiment of the present invention.
Figure 5B:
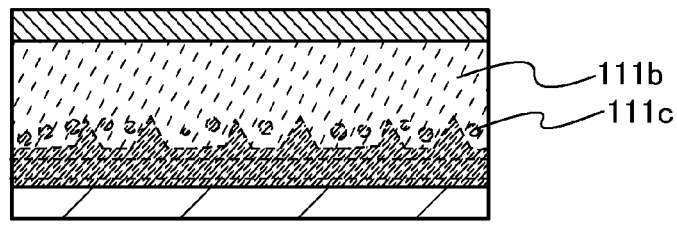

FIGS. 5A and 5B are enlarged views of a portion between the gate insulating film 105 and the impurity semiconductor film 113 illustrated in FIG. 4C.

As illustrated in FIG. 5A, the microcrystalline semiconductor region 111a in the semiconductor film 111 has a projection and a depression; the projection has a conical or pyramidal shape whose width decreases from the gate insulating film 105 side toward the amorphous semiconductor region 111b side (a tip of the projection has an acute angle). Note that the microcrystalline semiconductor region 111a may have a projection whose width increases from the gate insulating film 105 side toward the amorphous semiconductor region 111b side (an inverted conical or pyramidal shape).

By setting the thickness of the seed crystal 107, the microcrystalline semiconductor film 109, and the microcrystalline semiconductor region 111a, that is, the distance from the interface between the gate insulating film 105 and the seed crystal 107 to the tip of the projection of the microcrystalline semiconductor region 111a to greater than or equal to 5 nm and less than or equal to 310 nm, the off-state current of the thin film transistor can be reduced.

Further, it is preferable that the oxygen concentration in the semiconductor film 111 which is measured by secondary ion mass spectrometry be less than $1 \times 10^{18}$ atoms/cm$^3$, because such an oxygen concentration can increase the crystallinity of the microcrystalline semiconductor region 111a. The nitrogen concentration profile of the semiconductor film 111 which is measured by secondary ion mass spectrometry has a peak concentration greater than or equal to $1 \times 10^{20}$ atoms/cm$^3$ and less than or equal to $1 \times 10^{21}$ atoms/cm$^3$, preferably greater than or equal to $2 \times 10^{20}$ atoms/cm$^3$ and less than or equal to $1 \times 10^{21}$ atoms/cm$^3$ or less.

The amorphous semiconductor region 111b includes an amorphous semiconductor containing nitrogen. Nitrogen in the amorphous semiconductor containing nitrogen may exist, for example, as an NH group or an NH$_2$ group. Amorphous silicon is used as an amorphous semiconductor.

The amorphous semiconductor containing nitrogen is a semiconductor having lower energy at an Urbach edge measured by a constant photocurrent method (CPM) or photoluminescence spectroscopy and a smaller amount of absorption spectra of defective levels as compared to a conventional amorphous semiconductor. In other words, as compared to the conventional amorphous semiconductor, the amorphous silicon containing nitrogen is a well-ordered semiconductor having fewer defects and a steep tail of a level at a band edge in the valence band. Since the amorphous semiconductor containing nitrogen has a steep tail of a level at a band edge in the valence band, the band gap is wide and tunnel current does not flow easily. Therefore, when the amorphous semiconductor containing nitrogen is provided between the microcrystalline semiconductor region 111a and the impurity semiconductor film 113, the off-state current of the thin film transistor can be reduced. In addition, by providing the amorphous semiconductor containing nitrogen, the on-state current and the field-effect mobility can be increased.

Further, a peak region of a spectrum of the amorphous semiconductor containing nitrogen obtained by low-temperature photoluminescence spectroscopy is greater than or equal to 1.31 eV and less than or equal to 1.39 eV. Note that a peak region of a spectrum of a microcrystalline semiconductor, typically microcrystalline silicon, obtained by low-temperature photoluminescence spectroscopy is greater than or equal to 0.98 eV and less than or equal to 1.02 eV, which shows that an amorphous semiconductor containing nitrogen is different from a microcrystalline semiconductor.

The microcrystalline semiconductor region 111a, as well as the amorphous semiconductor region 111b, may include a NH group or an NH$_2$ group.

Further, as illustrated in FIG. 5B, a semiconductor mixed phase grain 111c whose grain size is greater than or equal to 1 nm and less than or equal to 10 nm, preferably greater than or equal to 1 nm and less than or equal to 5 nm is included in the amorphous semiconductor region 111b, whereby the on-state current and the filed-effect mobility can be further increased.

A microcrystalline semiconductor having a projection shape (a conical or pyramidal shape) whose width decreases from the gate insulating film 105 side toward the amorphous semiconductor region 111b side is formed in the following manner. After a microcrystalline semiconductor is formed under a condition where a microcrystalline semiconductor is deposited, crystal growth is caused under a condition where crystal growth is suppressed while an amorphous semiconductor is deposited.

Since the microcrystalline semiconductor region 111a in the semiconductor film 111 has the conical or pyramidal shape or the inverted conical or pyramidal shape, resistance in the vertical direction (in the film thickness direction) of when voltage is applied between the source and drain electrodes in an on state, i.e. the resistance of the semiconductor film 111 can be lowered. Further, tunnel current does not easily flow since the amorphous semiconductor containing nitrogen which is a well-ordered semiconductor having fewer defects and a steep tail of a level at a band edge in the valence band is provided between the microcrystalline semiconductor region 111a and the impurity semiconductor film 113. Thus, in the thin film transistor described in this embodiment, the on-state current and the field-effect mobility can be increased and the off-state current can be reduced.

Here, the semiconductor film 111 including the microcrystalline semiconductor region 111a and the amorphous semiconductor region 111b is formed using the source gas including the gas containing nitrogen. Alternatively, the semiconductor film 111 including the microcrystalline semiconductor region 111a and the amorphous semiconductor region 111b can be formed in the following manner: the top surface of the microcrystalline semiconductor film 109 is exposed to a gas containing nitrogen so that nitrogen is adsorbed to the top surface of the microcrystalline semiconductor film 109, and then film deposition of the semiconductor film 111 including the microcrystalline semiconductor region 111a and the amorphous semiconductor region 111b is performed using hydrogen and a deposition gas containing silicon or germanium as a source gas.

The impurity semiconductor film 113 is formed using amorphous silicon to which phosphorus is added, microcrystalline silicon to which phosphorus is added, or the like. Alternatively, the impurity semiconductor film 113 can have a stacked structure of amorphous silicon to which phosphorus is added and microcrystalline silicon to which phosphorus is added. Note that, in the case of forming a p-channel thin film transistor as a thin film transistor, the impurity semiconductor film 113 is formed using microcrystalline silicon to which boron is added, amorphous silicon to which boron is added, or the like. In the case where the semiconductor film 111 forms an ohmic contact with wirings 129a and 129b which are formed later, the impurity semiconductor film 113 is not necessarily formed.

The impurity semiconductor film 113 is formed in a process chamber of the plasma CVD apparatus by glow discharge plasma using a mixture of hydrogen, phosphine (diluted with hydrogen or silane), and a deposition gas containing silicon, whereby amorphous silicon to which phosphorus is added or microcrystalline silicon to which phosphorus is added is formed. In the case of manufacturing a p-channel thin film transistor, the impurity semiconductor film 113 may be formed using glow discharge plasma using diborane instead of phosphine.

Further, in the case where the impurity semiconductor film 113 is formed using microcrystalline silicon to which phosphorus is added or microcrystalline silicon to which boron is added, a microcrystalline semiconductor film, typically a microcrystalline silicon film, is formed between the semiconductor film 111 and the impurity semiconductor film 113, so that characteristics of the interface can be improved. As a result, resistance generated at the interface between the impurity semiconductor film 113 and the semiconductor film 111 can be reduced. Therefore, the amount of current flowing through the source region, the semiconductor film, and the drain region of the thin film transistor can be increased and the on-state current and the field-effect mobility can be increased.

The mask 115 formed of a resist can be formed by a photolithography step.

Next, the seed crystal 107, the microcrystalline semiconductor film 109, the semiconductor film 111, and the impurity semiconductor film 113 are etched using the mask 115 formed of the resist. Through this step, the seed crystal 107, the microcrystalline semiconductor film 109, the semiconductor film 111, and the impurity semiconductor film 113 are divided for each element, whereby an island-shaped semiconductor stacked body 117 and an island-shaped impurity semiconductor film 121 are formed. The semiconductor stacked body 117 includes a microcrystalline semiconductor region 117a which includes part of the seed crystal 107, part of the microcrystalline semiconductor film 109, and part of the microcrystalline semiconductor region of the semiconductor film 111; and an amorphous semiconductor region 117b which includes the amorphous semiconductor region of the semiconductor film 111. Then, the mask 115 formed of the resist is removed (see FIG. 4D).

Figure 6A:
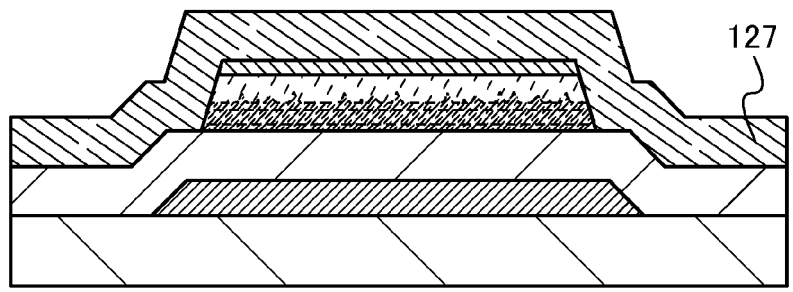
FIGS. 6A to 6C are cross-sectional views illustrating a method for manufacturing a semiconductor device according to one embodiment of the present invention.

Next, a conductive film 127 is formed over the impurity semiconductor film 121 (see FIG. 6A). The conductive film 127 can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode 103) may also be used. Crystalline silicon to which an impurity element which serves as a donor is added may be used. A stacked-layer structure in which a film on the side that is in contact with the crystalline silicon to which an impurity element serving as a donor is added is formed using titanium, tantalum, molybdenum, tungsten, or a nitride of any of these elements, and a layer of aluminum or an aluminum alloy is formed thereover may also be formed. The conductive film 127 may also have a stacked-layer structure where aluminum or an aluminum alloy is provided and titanium, tantalum, molybdenum, tungsten, or nitride of any of these elements is provided thereon and thereunder. The conductive film 127 is formed by a CVD method, a sputtering method, or a vacuum evaporation method. Alternatively, the conductive film 127 may be formed by discharging a conductive nanopaste of silver, gold, copper, or the like by a screen printing method, an inkjet method, or the like and baking the conductive nanopaste.

Figure 6B:
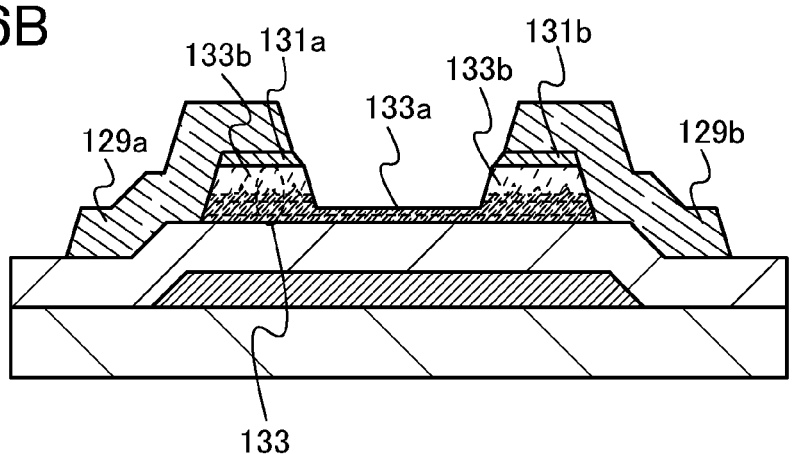

Then, a mask is formed of a resist by a photolithography step, and the conductive film 127 is etched with the use of the resist mask, whereby the wirings 129a and 129b serving as a source electrode and a drain electrode are formed (see FIG. 6B). The etching of the conductive film 127 may be either dry etching or wet etching. Note that one of the wirings 129a and 129b serves as a signal line as well as a source electrode or a drain electrode. However, without limitation thereto, a signal line may be provided separately from the source and drain electrodes.

Then, the impurity semiconductor film 121 and the semiconductor stacked body 117 are partly etched, whereby a pair of impurity semiconductor films 131*a* and 131*b* serving as a source and drain regions is formed. Also, a semiconductor stacked body 133 including a microcrystalline semiconductor region 133*a* and a pair of amorphous semiconductor regions 133*b* is formed. At this point, the semiconductor stacked body 117 is etched so that the microcrystalline semiconductor region 133*a* is exposed, whereby the semiconductor stacked body 133 having the following structure is formed: in regions which are covered with the wirings 129*a* and 129*b*, the microcrystalline semiconductor region 133*a* and the amorphous semiconductor regions 133*b* are stacked, and in a region which is covered with neither the wiring 129*a* nor the wiring 129*b* and overlaps with the gate electrode, the microcrystalline semiconductor region 133*a* is exposed.

Here, ends of the wirings 129*a* and 129*b* are aligned with ends of the impurity semiconductor films 131*a* and 131*b*. However, the ends of the wirings 129*a* and 129*b* and the ends of the impurity semiconductor films 131*a* and 131*b* are not necessarily aligned with each other; the ends of the wirings 129*a* and 129*b* may be positioned on the inner side than the ends of the impurity semiconductor films 131*a* and 131*b* in a cross section.

Next, dry etching may be performed. The dry etching is performed under a condition where the exposed microcrystalline semiconductor region 133*a* and the exposed amorphous semiconductor regions 133*b* are not damaged and the etching rates of the microcrystalline semiconductor region 133*a* and the amorphous semiconductor regions 133*b* are low. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Then, the surfaces of the microcrystalline semiconductor region 133*a* and the amorphous semiconductor regions 133*b* are subjected to plasma treatment typified by water plasma treatment, oxygen plasma treatment, ammonia plasma treatment, nitrogen plasma treatment, plasma treatment using a mixed gas of oxygen and hydrogen, or the like.

Water plasma treatment can be performed in such a manner that a gas containing water as a main component typified by water vapor ($H_2O$ vapor) is introduced into a reaction space and plasma is generated. After that, the mask formed of a resist is removed. The mask formed of a resist may be removed before the dry etching of the impurity semiconductor film 121 and the semiconductor stacked body 117.

As described above, after the microcrystalline semiconductor region 133*a* and the amorphous semiconductor regions 133*b* are formed, dry etching is additionally performed under a condition where the microcrystalline semiconductor region 133*a* and the amorphous semiconductor regions 133*b* are not damaged, whereby an impurity such as a residue over the exposed microcrystalline semiconductor region 133*a* and the exposed amorphous semiconductor regions 133*b* can be removed. Further, after the dry etching, water plasma treatment is successively performed, whereby a residue of the resist mask can be removed and defects of the microcrystalline semiconductor region 133*a* can be reduced. Further, by the plasma treatment, insulation between the source region and the drain region can be ensured. Thus, in the resulting thin film transistors, off-state current can be reduced and a variation in electrical characteristics can be reduced.

Note that the mask is formed of a resist by a photolithography step over the conductive film 127, and the conductive film 127 is etched using the resist mask; whereby the wirings 129*a* and 129*b* serving as the source and drain electrodes are formed. Then, the impurity semiconductor film 121 is etched, whereby the pair of impurity semiconductor films 131*a* and 131*b* serving as the source and drain electrodes is formed. At this time, part of the semiconductor stacked body 117 is etched in some cases. Then, the semiconductor stacked body 117 may be partly etched after the mask formed of a resist is removed to form the semiconductor stacked body 133 including the microcrystalline semiconductor region 133*a* and the pair of amorphous semiconductor regions 133*b*.

Since the microcrystalline semiconductor region 117*a* is covered with the amorphous semiconductor region 117*b* in the step of removing the mask formed of a resist, the microcrystalline semiconductor region 117*a* is prevented from being in contact with a resist stripper and a residue of the resist. Further, since the amorphous semiconductor region 117*b* is etched using the wirings 129*a* and 129*b* to expose the microcrystalline semiconductor region 133*a* after the mask formed of a resist is removed, the amorphous semiconductor region which is in contact with the resist stripper and a residue of the resist is not left in a back channel. Consequently, leakage current due to the resist stripper and the residue of the resist left in the back channel is not generated, which can further reduce the off-state current of the thin film transistor.

Through the above-described process, a single-gate thin film transistor can be manufactured. Since the microcrystalline semiconductor film in which a channel region is formed in the thin film transistor described in this embodiment has high crystallinity and high uniformity of grain sizes of mixed phase grains, variation of thin film transistors can be reduced. A single-gate thin film transistor with low off-state current, high on-state current, and high field-effect mobility can be manufactured with high productivity.

Then, an insulating film (also referred to as a second gate insulating film) 137 is formed over the semiconductor stacked body 133 and the wirings 129*a* and 129*b*. The insulating film 137 can be formed in a manner similar to that of the gate insulating film 105.

Then, an opening (not illustrated) is formed in the insulating film 137 with the use of a mask which is formed of a resist by a photolithography step. Then, a back gate electrode (also referred to as a second gate electrode) 139 is formed over the insulating film 137 (see FIG. 6C). Through the above-described process, a dual-gate thin film transistor can be manufactured.

The back gate electrode 139 can be formed in a manner similar to that of the wirings 129*a* and 129*b*. The back gate electrode 139 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the back gate electrode 139 can be formed using a conductive composition including a conductive high molecule (also referred to as a conductive polymer) having a light-transmitting property. The back gate electrode 139 preferably has a sheet resistance of 10000 Ω/sq. or less and a light transmittance of 70% or greater at a wavelength of 550 nm. Further, the resistivity of the conductive high molecule included in the conductive composition is preferably 0.1 Ω·cm or less.

As the conductive high molecule, a so-called π-electron conjugated conductive high molecule can be used. For example, polyaniline and a derivative thereof, polypyrrole and a derivative thereof, polythiophene and a derivative thereof, and a copolymer of two or more of aniline, pyrrole, and thiophene and a derivative thereof can be given.

The back gate electrode 139 can be formed by forming a thin film using any of the above materials by a sputtering method, and then etching the thin film using a mask formed of a resist by a photolithography step. Alternatively, the back gate electrode 139 can be formed by applying or printing the conductive composition including a conductive high molecule having a light-transmitting property, and baking the composition.

Next, the shape of the back gate electrode is described with reference to FIGS. 7A to 7D, which are plan views of the thin film transistor.

Figure 7A:
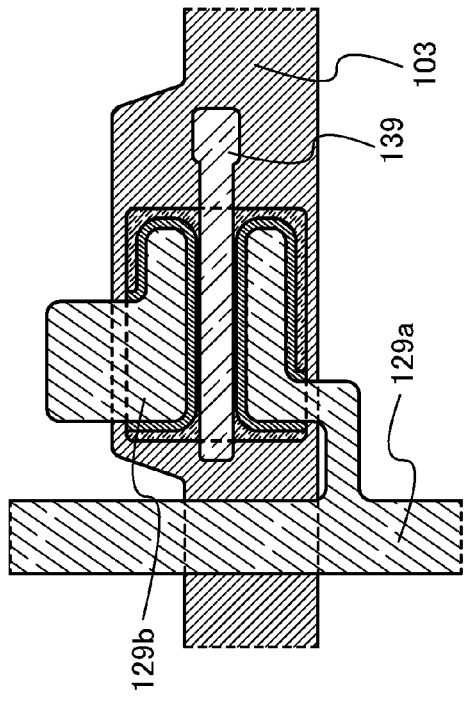
FIGS. 7A to 7D are top views illustrating a method for manufacturing a semiconductor device according to one embodiment of the present invention.

As illustrated in FIG. 7A, the back gate electrode 139 can be formed in parallel to the gate electrode 103. In this case, potential applied to the back gate electrode 139 and potential applied to the gate electrode 103 can be controlled independently. Thus, the threshold voltage of the thin film transistor can be controlled. Further, regions in which carriers flow, that is, channel regions are formed on the gate insulating film 105 side and on the insulating film 137 side in the microcrystalline semiconductor region; thus, the on-state current of the thin film transistor can be increased.

Figure 7B:
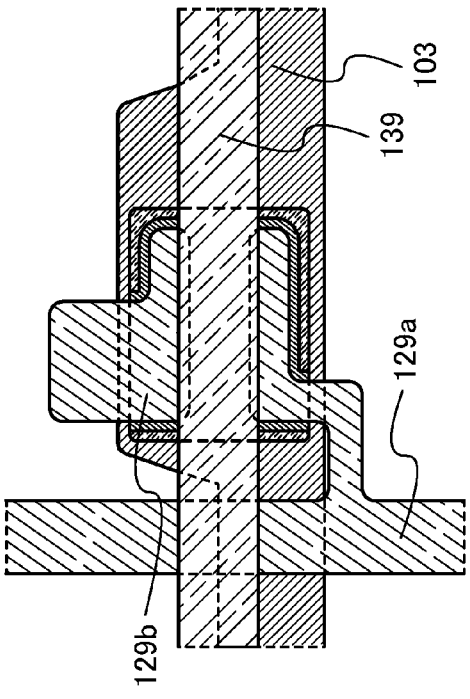

As illustrated in FIG. 7B, the back gate electrode 139 can be connected to the gate electrode 103. That is, the gate electrode 103 and the back gate electrode 139 can be connected through an opening 150 formed in the gate insulating film 105 and the insulating film 137. In this case, potential applied to the back gate electrode 139 and potential applied to the gate electrode 103 are equal. Therefore, regions in which carriers flow in a semiconductor film, that is, channel regions are formed on the gate insulating film 105 side and on the insulating film 137 side in the microcrystalline semiconductor region; thus, the on-state current of the thin film transistor can be increased.

Figure 7C:
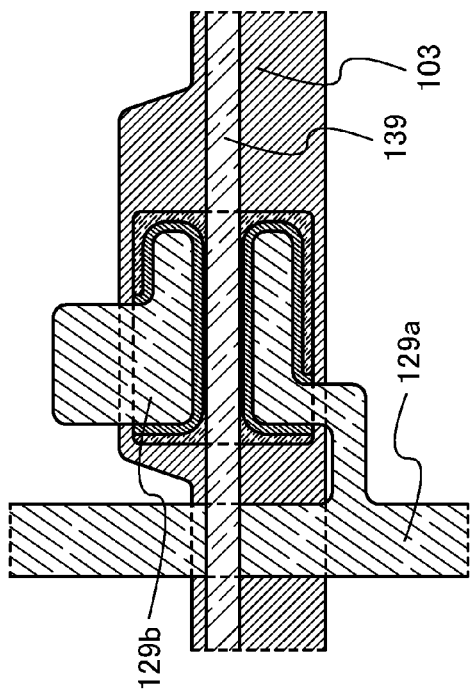

Further alternatively, as illustrated in FIG. 7C, a structure in which the back gate electrode 139 is not connected to the gate electrode 103 and is in a floating state can be employed. In that case, channel regions are formed on the gate insulating film 105 side and on the insulating film 137 side in the microcrystalline semiconductor region without potential applied to the back gate electrode 139; thus, the on-state current of the thin film transistor can be increased.

Figure 7D:
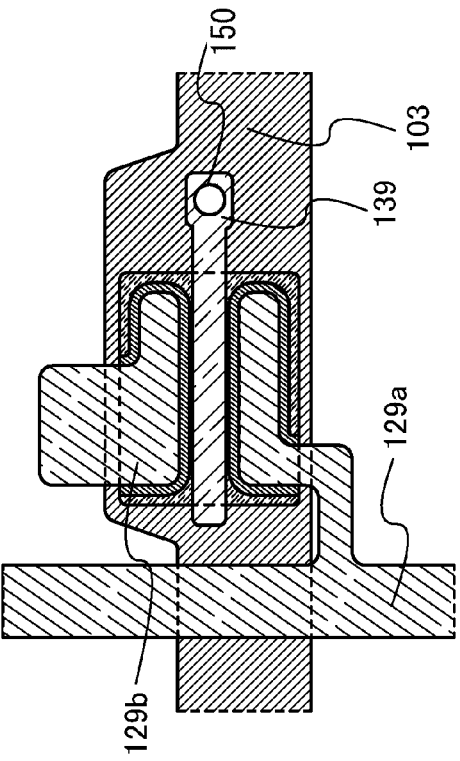

Further, as illustrated in FIG. 7D, the back gate electrode 139 may overlap with the wirings 129a and 129b with the insulating film 137 provided therebetween. Although the back gate electrode 139 of FIG. 7A is used in FIG. 7D, it is possible that the back gate electrode 139 of FIG. 7B or FIG. 7C overlap with the wirings 129a and 129b.

In each of the single-gate thin film transistor and the dual-gate thin film transistor which are described in this embodiment, a channel region can be formed using a microcrystalline semiconductor film having high crystallinity and high uniformity of grain sizes of mixed phase grains. Therefore, the number of carriers that move in the single-gate thin film transistor and dual-gate thin film transistor is increased, so that the on-state current and the field-effect mobility can be increased. Further, variation in electrical characteristics of thin film transistors can be reduced. Furthermore, since the amorphous semiconductor regions 133b are provided between the microcrystalline semiconductor region 133a and the impurity semiconductor films 131a and 131b, the off-state current of the thin film transistor can be reduced. Accordingly, the area of the single-gate thin film transistor and the area of the dual-gate thin film transistor can be reduced, which enables high integration of a semiconductor device. Further, when the thin film transistor described in this embodiment is used for a driver circuit of a display device, the area of the driver circuit can be decreased, which enables the frame of the display device to be narrowed.

Note that in this embodiment, the microcrystalline semiconductor film is formed in accordance with Embodiment 1; however, the microcrystalline semiconductor film can also be formed in accordance with Embodiment 2. Further, when a dual-gate thin film transistor is formed using the microcrystalline semiconductor film described in Embodiment 2, the crystallinity of the microcrystalline semiconductor film is high on the back gate electrode side, so that the dual-gate thin film transistor can have further excellent electrical characteristics.

Embodiment 4

In this embodiment, a method for manufacturing a thin film transistor, by which the off-state current can be further reduced as compared to the off-state current in Embodiment 3, will be described with reference to FIGS. 4A to 4D and FIGS. 8A to 8C.

Figure 8A:
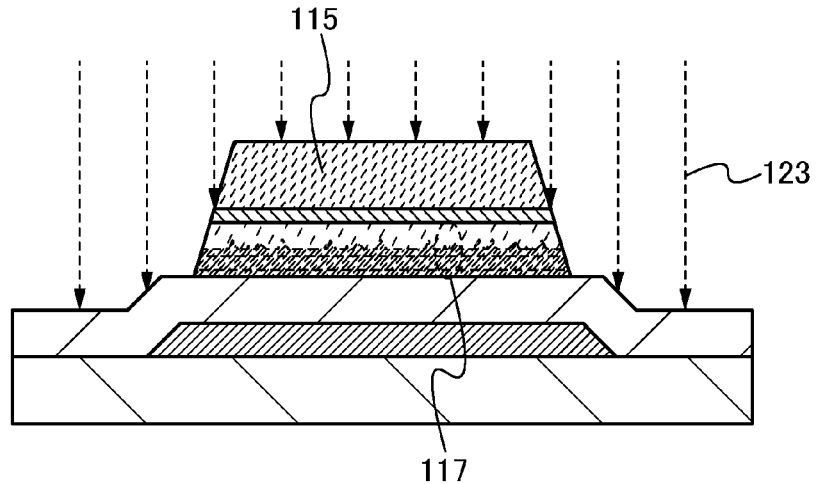
FIGS. 8A to 8C are cross-sectional views illustrating a method for manufacturing a semiconductor device according to one embodiment of the present invention.

As in Embodiment 3, the semiconductor stacked body 117 in FIG. 8A is formed through the process illustrated in FIGS. 4A to 4C.

Next, plasma treatment is performed in which a side surface of the semiconductor stacked body 117 is exposed to plasma 123 while the mask 115 formed of a resist is left. Here, plasma is generated in an oxidizing gas atmosphere or a nitriding gas atmosphere, and the semiconductor stacked body 117 is exposed to the plasma 123. Examples of the oxidizing gas include oxygen, ozone, dinitrogen monoxide, water vapor, and a mixed gas of oxygen and hydrogen. Examples of the nitriding gas include nitrogen, ammonia, nitrogen fluoride, nitrogen chloride, chloroamine, and fluoroamine. By generating plasma in an oxidizing gas or a nitriding gas, an oxygen radical or a nitrogen radical is generated. The radical reacts with the semiconductor stacked body 117, so that an insulating region serving as a barrier region is formed on the side surface of the semiconductor stacked body 117. Note that instead of irradiation with plasma, irradiation with ultraviolet light may be performed for generation of an oxygen radical or a nitrogen radical.

Figure 8B:
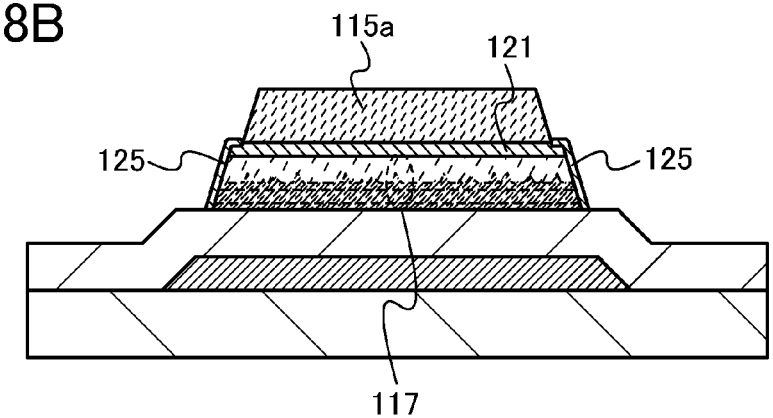
Figure 8C:
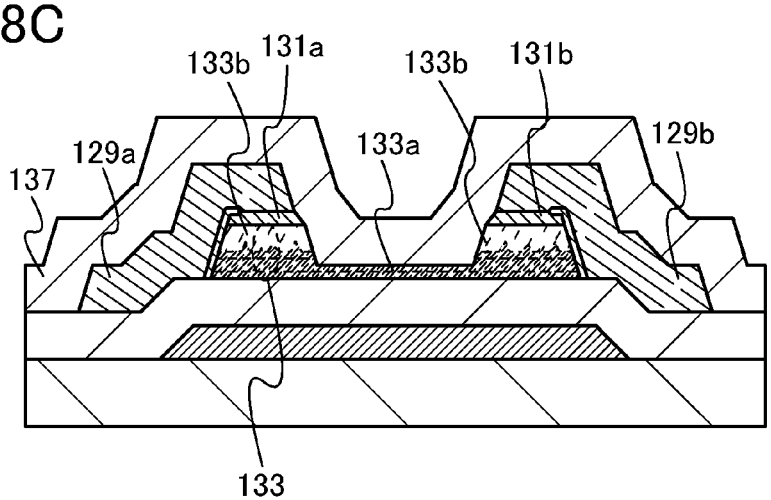

In the case of using oxygen, ozone, water vapor, or a mixed gas of oxygen and hydrogen as the oxidizing gas, the mask 115 formed of the resist recedes by plasma irradiation, whereby a mask 115a formed of the resist having a smaller top surface than the mask 115 formed of the resist is formed as illustrated in FIG. 8B. Consequently, through the plasma treatment, the exposed impurity semiconductor film 121 is oxidized in addition to the side surface of the semiconductor stacked body 117, whereby an insulating region 125 serving as a barrier region is formed on the side surface of the semiconductor stacked body 117 and on the side surface and part of the top surface of the impurity semiconductor film 121.

Figure 6C:
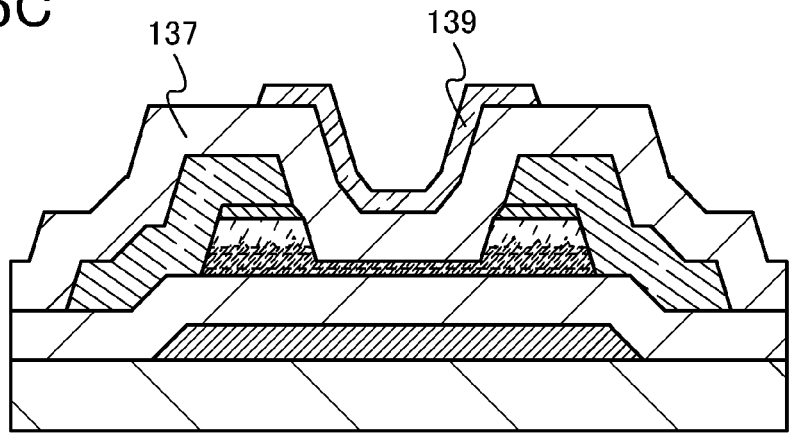

Next, as described in Embodiment 3, through the process illustrated in FIGS. 6A and 6B, the wirings 129a and 129b serving as a source electrode and a drain electrode, the pair of impurity semiconductor films 131a and 131b serving as a source region and a drain region, the semiconductor stacked body 133 including the microcrystalline semiconductor region 133a and the pair of amorphous semiconductor regions 133b, and the insulating film 137 are formed as illustrated in FIG. 6C. Thus, a single-gate thin film transistor can be manufactured.

When a back gate electrode is formed over the insulating film 137, a dual-gate thin film transistor can be manufactured.

In the single-gate thin film transistor and the dual-gate thin film transistor which are described in this embodiment, the channel region can be formed using a microcrystalline semiconductor film having high crystallinity and high uniformity of grain sizes of mixed phase grains. Furthermore, by providing the insulating region which is a barrier region between the semiconductor stacked body 133 and the wiring 129a or 129b, holes injected from the wiring 129a or 129b to the semiconductor stacked body 133 can be reduced; thus, the variation is reduced, the off-state current of the thin film transistor is reduced and the on-state current and the field-effect mobility of the thin film transistor are increased. Accordingly, the area of the thin film transistor can be reduced, which enables high integration of a semiconductor device. Further, when the thin film transistor described in this embodiment is used for a driver circuit of a display device, the size of the driver circuit can be decreased, which enables the frame of the display device to be narrowed.

In this embodiment, the description is made with reference to Embodiment 3; however, the description can be made with reference to another embodiment as appropriate.

Embodiment 5

Figure 9:
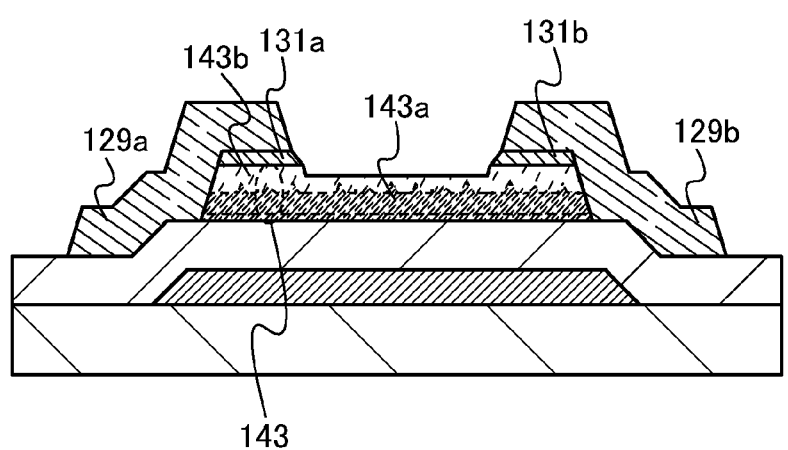
FIG. 9 is a cross-sectional view illustrating a method for manufacturing a semiconductor device according to one embodiment of the present invention.

In this embodiment, a method for manufacturing a thin film transistor formed in a semiconductor device that is one embodiment of the present invention will be described with reference to FIGS. 4A to 4D, FIGS. 6A to 6C, and FIG. 9. FIG. 9 shows a step corresponding to the step illustrated in FIG. 6B.

As in Embodiment 3, the conductive film 127 is formed through the process of FIGS. 4A to 4D and FIG. 6A.

Then, as illustrated in FIG. 9, the wirings 129a and 129b are formed and the impurity semiconductor film 121 and the semiconductor stacked body 117 are partly etched, whereby the pair of impurity semiconductor films 131a and 131b serving as a source and drain regions is formed as in Embodiment 3. Also, a semiconductor stacked body 143 including a microcrystalline semiconductor region 143a and an amorphous semiconductor region 143b is formed. At this point, part of the impurity semiconductor film and part of the amorphous semiconductor region are etched, whereby the semiconductor stacked body 143 having the following structure is formed: in the regions which are covered with the wirings 129a and 129b, the microcrystalline semiconductor region 143a and the amorphous semiconductor region 143b are stacked, and in the region which is covered with neither the wiring 129a nor the wiring 129b and overlaps with the gate electrode, the microcrystalline semiconductor region 143a is not exposed and the amorphous semiconductor region 143b is exposed. Note that the etching amount of the semiconductor stacked body 117 here is smaller than that in the case illustrated in FIG. 6B.

The subsequent steps are similar to those in Embodiment 3.

Through the above-described process, a single-gate thin film transistor can be manufactured. Since the back channel side is amorphous in this thin film transistor, the off-state current can be reduced as compared to the thin film transistor illustrated in FIG. 6B.

In this embodiment, after the step illustrated in FIG. 9, the back gate electrode 139 may be formed over the thin film transistor with the insulating film 137 interposed therebetween as in the step illustrated in FIG. 6C.

This embodiment can be implemented in appropriate combination with any of the other embodiments.

Embodiment 6

Thin film transistors are manufactured, and a semiconductor device having a display function (also referred to as a display device) can be manufactured using the thin film transistors in a pixel portion and also in a driver circuit. Further, part or the whole of the driver circuit which includes thin film transistors can be formed over the same substrate as the pixel portion, whereby a system-on-panel can be formed.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes an inorganic EL (electroluminescence) element, an organic EL element, and the like. Furthermore, the display device may include a display medium whose contrast is changed by an electric effect, such as electronic ink.

In addition, the display device includes a panel in which the display element is sealed, and a module in which an IC or the like including a controller is mounted on the panel. Further, an embodiment of the present invention relates to one mode of an element substrate before the display element is completed in a process of manufacturing the display device, and the element substrate is provided with a plurality of pixels each having a means for supplying current to the display element. Specifically, the element substrate may be in a state where only a pixel electrode of the display element is formed, a state in which a conductive film to be a pixel electrode is formed but is not etched yet to form the pixel electrode, or any of the other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or TCP provided with a printed wiring board at the end thereof; and a module having an integrated circuit (IC) that is directly mounted on a display element by a chip on glass (COG) method.

Embodiment 7

In this embodiment, a photoelectric conversion device that is one embodiment of a semiconductor device will be described. In the photoelectric conversion device described in this embodiment, a microcrystalline semiconductor film, as described in Embodiment 1 or Embodiment 2, having high crystallinity and high uniformity of grain sizes of mixed phase grains is used as a semiconductor film. The microcrystalline semiconductor film having high crystallinity and high uniformity of grain sizes of mixed phase grains is applicable to a semiconductor film having a function of photoelectric conversion, a semiconductor film having a conductivity type, or the like, and is preferably, in particular, applied to the semiconductor film having a function of photoelectric conversion. Further, the microcrystalline semiconductor film having high crystallinity and high uniformity of grain sizes of mixed phase grains can be provided at an interface between the semiconductor film having a function of photoelectric conversion or the semiconductor film having a conductivity type and another film.

By employing the structure described above, resistance (series resistance) caused by the semiconductor film having a function of photoelectric conversion or the semiconductor film having a conductivity type can be reduced, resulting in improvement of characteristics. Further, it is possible to reduce optical and electrical loss at the interface between the semiconductor film having a function of photoelectric conversion or the semiconductor film having a conductivity type and another film, which can improve the photoelectric conversion efficiency. With reference to FIGS. 10A to 10E, one embodiment of a method for manufacturing a photoelectric conversion device will be described.

Figure 10A:
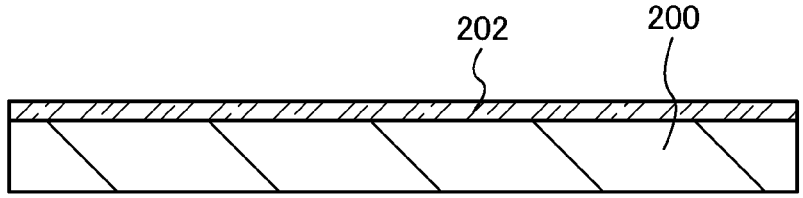
FIGS. 10A to 10E are cross-sectional views illustrating one embodiment of a method for manufacturing a photoelectric conversion device.

As illustrated in FIG. 10A, a first electrode 202 is formed over a substrate 200.

As the substrate 200, any of the substrates that can be used for the substrate 51 described in Embodiment 1 can be used as appropriate. Alternatively, a plastic substrate can be used. As the plastic substrate, it is preferable to use a substrate containing a thermosetting resin such an epoxy resin, an unsaturated polyester resin, a polyimide resin, a bismaleimide-triazine resin, or a cyanate resin, or a substrate containing a thermoplastic resin such as a polyphenylene oxide resin, a polyetherimide resin, or a fluorine resin.

Note that the substrate 200 may have a texture structure. Accordingly, photoelectric conversion efficiency can be improved.

In this embodiment, light is incident on the back side (the lower side in the drawing) of the substrate 200; thus, a light-transmitting substrate is used. Note that when a structure is employed in which light is incident on a side of a second electrode 210 to be formed later (the upper side in the drawing), the substrate is not limited to a light-transmitting substrate. In this case, a semiconductor substrate containing a material such as silicon or a conductive substrate containing a metal material or the like may be used.

The first electrode 202 can be formed using a light-transmitting conductive material that can be used for the back gate electrode 139 described in Embodiment 3. The first electrode 202 is formed by a sputtering method, a CVD method, a vacuum evaporation method, a coating method, a printing method, or the like.

The first electrode 202 is formed to a thickness of 10 nm to 500 nm, preferably 50 nm to 100 nm. The sheet resistance of the first electrode 202 is set to about 20 Ω/sq. to 200 Ω/sq.

Note that in this embodiment, light is incident on the back side (the lower side in the drawing) of the substrate 200; thus, the first electrode 202 is formed using a light-transmitting conductive material. Note that when a structure is employed in which light is incident on a side of a second electrode 210 to be formed later (the upper side in the drawing), the material of the substrate is not limited to a light-transmitting conductive material. In such a case, the first electrode 202 can be formed using a conductive material that does not have a light-transmitting property such as aluminum, platinum, gold, silver, copper, titanium, tantalum, or tungsten. In particular, when a material that easily reflects light, such as aluminum, silver, titanium, or tantalum, is used, photoelectric conversion efficiency can be sufficiently improved.

Like the substrate 200, the first electrode 202 may have a texture structure. Further, an auxiliary electrode formed using a low-resistance conductive material may be separately formed so as to be in contact with the first electrode 202.

Figure 10B:
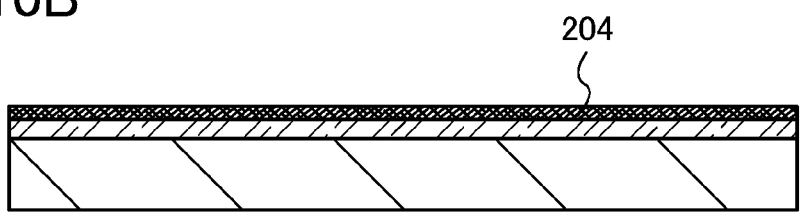

Next, as illustrated in FIG. 10B, a semiconductor film 204 having the first conductivity type is formed over the first electrode 202. The semiconductor film 204 having the first conductivity type is typically formed using a semiconductor film containing a semiconductor material to which an impurity element imparting a conductivity type is added. Silicon is suitable as a semiconductor material, in terms of productivity, price, and the like. When silicon is used as the semiconductor material, phosphorus or arsenic, which imparts n-type conductivity, or boron or aluminum, which imparts p-type conductivity, is used as the impurity element imparting a conductivity type.

In this embodiment, light is incident on the back side (the lower side in the drawing) of the substrate 200; thus, the conductivity type (the first conductivity type) of the semiconductor film 204 having the first conductivity type is preferably p-type. This is because, for instance, the diffusion length of holes is short owing to the lifetime of a hole which is as short as about half the lifetime of an electron, and because more electrons and holes are formed on the side where light is incident on a semiconductor film 206 having a function of photoelectric conversion. When the first conductivity type is p-type, current can be extracted before holes are annihilated, whereby a decrease in photoelectric conversion efficiency can be suppressed. Note that when the above problems do not occur, for example, when the semiconductor film 206 having a function of photoelectric conversion is sufficiently thin, the first conductivity type may be n-type.

There are other semiconductor materials which can be used for the semiconductor film 204 having the first conductivity type; for example, silicon carbide, germanium, gallium arsenide, indium phosphide, zinc selenide, gallium nitride, and silicon germanium are given. Further, a semiconductor material containing an organic material, a semiconductor material containing a metal oxide, or the like can be used. The material can be selected as appropriate in consideration of the semiconductor film 206 having a function of photoelectric conversion.

Although there is no particular limitation on the crystallinity of the semiconductor film 204 having the first conductivity type, it is preferable to use the microcrystalline semiconductor film having high crystallinity and high uniformity of grain sizes of mixed phase grains, which is described in Embodiment 1 or Embodiment 2, as the semiconductor film 204 having the first conductivity type. This is because in this case, as compared with the case of using a conventional microcrystalline semiconductor film, it is possible to reduce series resistance and to suppress optical and electrical loss at the interface between the microcrystalline semiconductor film whose crystallinity is increased and another film. It is needless to say that another semiconductor such as an amorphous semiconductor, a polycrystalline semiconductor, and a single crystal semiconductor can also be used.

Like the substrate 200, the semiconductor film 204 having the first conductivity type may have a texture structure.

The semiconductor film 204 having the first conductivity type can be formed by a plasma CVD method using diborane and a deposition gas containing silicon. Further, the semiconductor film 204 having the first conductivity type is formed to a thickness of 1 nm to 100 nm, preferably 5 nm to 50 nm.

Alternatively, the semiconductor film 204 having the first conductivity type may be formed as follows: a silicon film to which an impurity element imparting a conductivity type is not added is formed by a plasma CVD method or the like; and boron is added by an ion implantation method or the like.

Figure 10C:
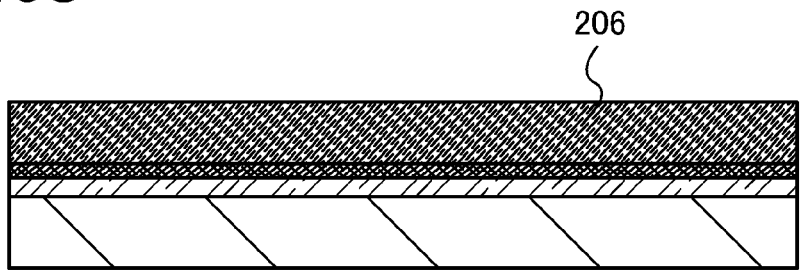

Next, as illustrated in FIG. 10C, the semiconductor film 206 having a function of photoelectric conversion is formed over the semiconductor film 204 having the first conductivity type. For the semiconductor film 206 having a function of photoelectric conversion, a semiconductor film formed using a semiconductor material which is similar to that of the semiconductor film 204 is used. In other words, as the semiconductor material, silicon, silicon carbide, germanium, gallium arsenide, indium phosphide, zinc selenide, gallium nitride, silicon germanium, or the like is used. In particular, silicon is preferably used. Alternatively, a semiconductor material containing an organic material, a semiconductor material containing a metal oxide, or the like can be used.

As the semiconductor film 206 having a function of photoelectric conversion, the microcrystalline semiconductor film having high crystallinity and high uniformity of grain sizes of mixed phase grains, such as that described in Embodiment 1 or Embodiment 2, is preferably used. By applying the microcrystalline semiconductor film having high crystallinity and high uniformity of grain sizes of mixed phase grains, such as that described in Embodiment 1 or Embodiment 2, to the semiconductor film, it is possible to reduce series resistance and to suppress optical and electrical loss at the interface between the microcrystalline semiconductor film whose crystallinity is increased and another film as compared with the case of using a conventional microcrystalline semiconductor film.

Because the semiconductor film 206 having a function of photoelectric conversion needs to absorb light sufficiently, it preferably has a thickness of about 100 nm to 10 μm.

Figure 10D:
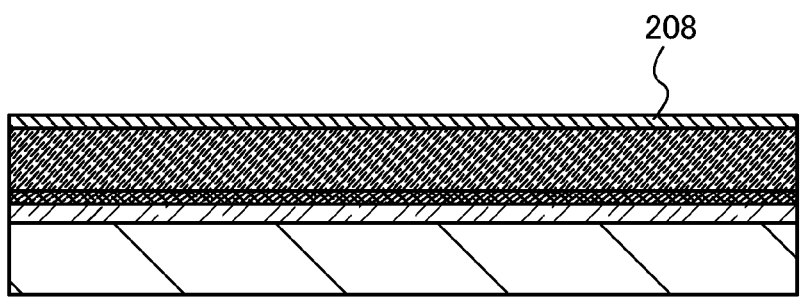

Next, as illustrated in FIG. 10D, a semiconductor film 208 having the second conductivity type is formed over the semiconductor film 206 having a function of photoelectric conversion. In this embodiment, the second conductivity type is n-type. The semiconductor film 208 having the second conductivity type can be formed using a material such as silicon to which phosphorus is added as an impurity element imparting a conductivity type. Semiconductor materials that can be used for the semiconductor film 208 having the second conductivity type are similar to those for the semiconductor film 204 having the first conductivity type.

The semiconductor film 208 having the second conductivity type can be formed in a manner similar to that of the semiconductor film 204 having the first conductivity type. For example, the semiconductor film 208 having the second conductivity type can be formed by a plasma CVD method using phosphine and a deposition gas containing silicon. As the semiconductor film 208 having the second conductivity type, the microcrystalline semiconductor film having high crystallinity and high uniformity of grain sizes of mixed phase grains, which is described in Embodiment 1 or Embodiment 2, is preferably used.

In this embodiment, light is incident on the back side (the lower side in the drawing) of the substrate 200; thus, the conductivity type (the second conductivity type) of the semiconductor film 208 is n-type; however, one embodiment of the disclosed invention is not limited thereto. When the first conductivity type is n-type, the second conductivity type is p-type.

Figure 10E:
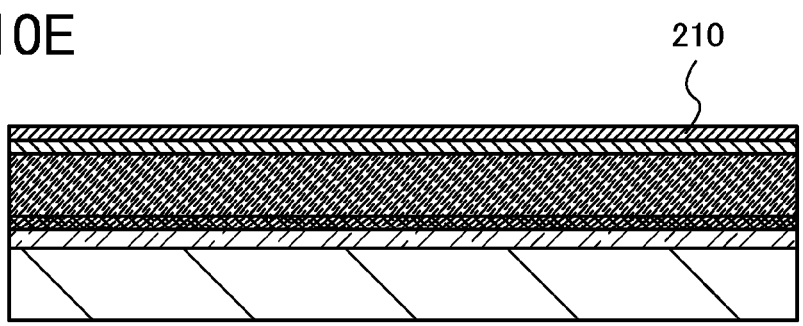

Then, as illustrated in FIG. 10E, the second electrode 210 is formed over the semiconductor film 208 having the second conductivity type. The second electrode 210 is formed using a conductive material such as metal. They can be formed using a material that easily reflects light, such as aluminum, silver, titanium, or tantalum. Such a material is preferably used because light that fails to be absorbed by the semiconductor film 206 can be incident on the semiconductor film 206 again; thus, photoelectric conversion efficiency can be improved.

As a method of forming the second electrode 210, there are a sputtering method, a vacuum evaporation method, a CVD method, a coating method, a printing method, and the like. Further, the second electrode 210 is formed to a thickness of 10 nm to 500 nm, preferably 50 nm to 100 nm.

Note that in this embodiment, light is incident on the back side (the lower side in the drawing) of the substrate 200 and the second electrode 210 is formed using a conductive material which does not have a light-transmitting property, but the structure of the second electrode 210 is not limited thereto. For example, when light is incident on the second electrode 210 side (the upper side in the drawing), the second electrode 210 can be formed using any of the light-transmitting conductive materials for the first electrode 202.

Further, an auxiliary electrode formed using a low-resistance conductive material may be formed so as to be in contact with the second electrode 210.

By the above method, it is possible to manufacture a photoelectric conversion device in which a microcrystalline semiconductor film having high crystallinity and high uniformity of grain sizes of mixed phase grains is used as any of a semiconductor film having a function of photoelectric conversion, a semiconductor film having the first conductivity type, and a semiconductor film having the second conductivity type. This can enhance the photoelectric conversion efficiency of a photoelectric conversion device. Note that, as long as the microcrystalline semiconductor film having high crystallinity and high uniformity of grain sizes of mixed phase grains is used as one of the semiconductor film having a function of photoelectric conversion, the semiconductor film having the first conductivity type, and the semiconductor film having the second conductivity type, the film to which the microcrystalline semiconductor film is applied can be changed as appropriate. Further, when the microcrystalline semiconductor films having high crystallinity and high uniformity of grain sizes of mixed phase grains are used as more than one of the above semiconductor films, the photoelectric conversion efficiency can be more effectively improved.

Note that although a photoelectric conversion device having one unit cell is described in this embodiment, a photoelectric conversion device in which two or more unit cells are stacked as appropriate may be provided.

This embodiment can be implemented in appropriate combination with any of the other embodiments.

Embodiment 8

Figure 11:
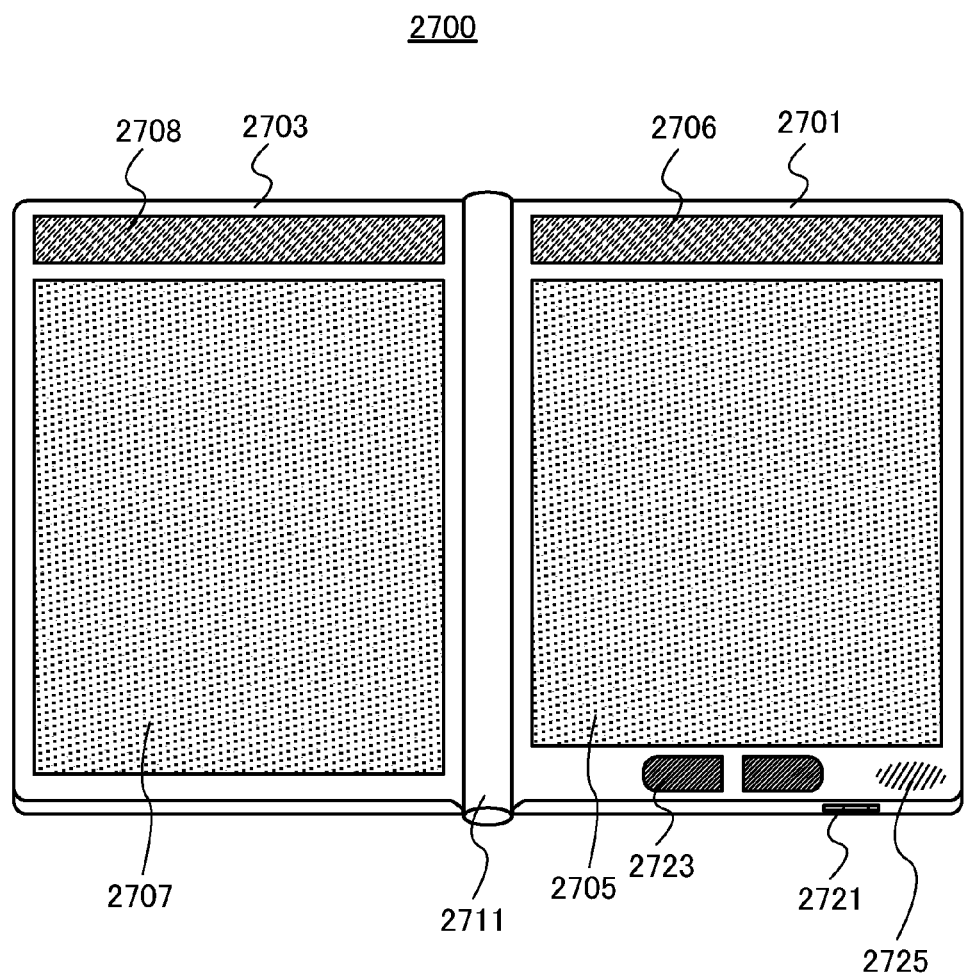
FIG. 11 is a perspective view illustrating an example of an e-book reader.

A semiconductor device disclosed in this specification can be applied to an electronic paper. The electronic paper can be used for electronic devices for displaying information in a variety of fields. For example, an electronic paper can be applied to electronic book readers (e-book readers), posters, digital signage, public information displays (PIDs), advertisements in vehicles such as trains, and displays of various cards such as credit cards. FIG. 11 illustrates an example of the electronic devices.

FIG. 11 illustrates an example of an electronic book reader. For example, an electronic book reader 2700 includes two housings, a housing 2701 and a housing 2703. The housing 2701 and the housing 2703 are combined with the use of a hinge 2711 so that the electronic book reader 2700 can be opened and closed using the hinge 2711 as an axis. With such a structure, the electronic book reader 2700 can be handled like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display a continuous image or different images. In the case where the display portions display different images, for example, a display portion on the right (the display portion 2705 in FIG. 11) can display text and a display portion on the left (the display portion 2707 in FIG. 11) can display graphics.

FIG. 11 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to an AC adapter or a variety of cables such as a USB cable, or the like), a storage medium insertion portion, and the like may be provided on the back surface or the side surface of the housing. Moreover, the electronic book reader 2700 may have a function of an electronic dictionary.

The electronic book reader 2700 may be configured to wirelessly transmit and receive data. Through wireless communication, desired book data or the like can be purchased and downloaded from an electronic book server.

Embodiment 9

The semiconductor device disclosed in this specification can be applied to a variety of electronic devices (including game machines). Examples of such electronic devices include a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio player, a large-sized game machine such as a pinball machine, and the like.

Figure 12A:
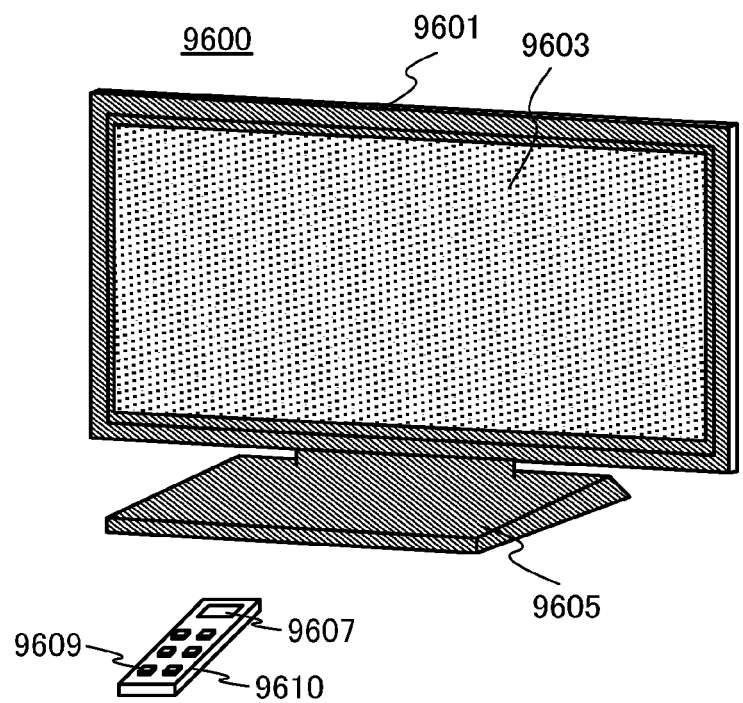
FIGS. 12A and 12B are perspective views illustrating examples of a television set and a digital photo frame.

FIG. 12A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data output from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 12B:
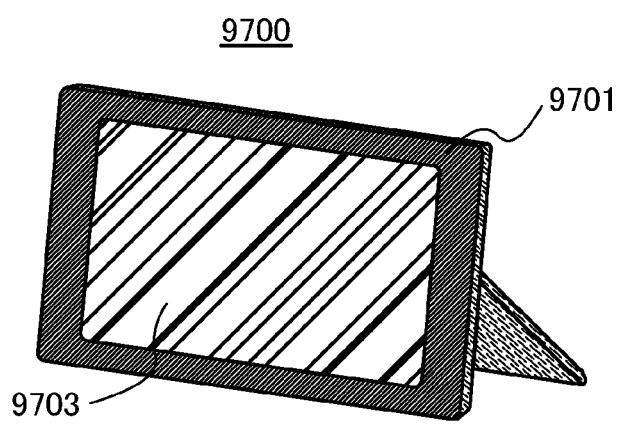

FIG. 12B illustrates an example of a digital photo frame. In a digital photo frame 9700, for example, a display portion 9703 is incorporated in a housing 9701. The display portion 9703 can display a variety of images. For example, the display portion can display image data taken with a digital camera or the like and function like a normal photo frame.

Note that the digital photo frame 9700 is provided with an operation portion, an external connection terminal (e.g., a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, a memory that stores image data taken with a digital camera is inserted into the storage medium insertion portion of the digital photo frame and the data can be loaded and displayed on the display portion 9703.

The digital photo frame 9700 may be configured to transmit and receive data wirelessly. Through wireless communication, desired image data can be loaded to be displayed.

Figure 13:
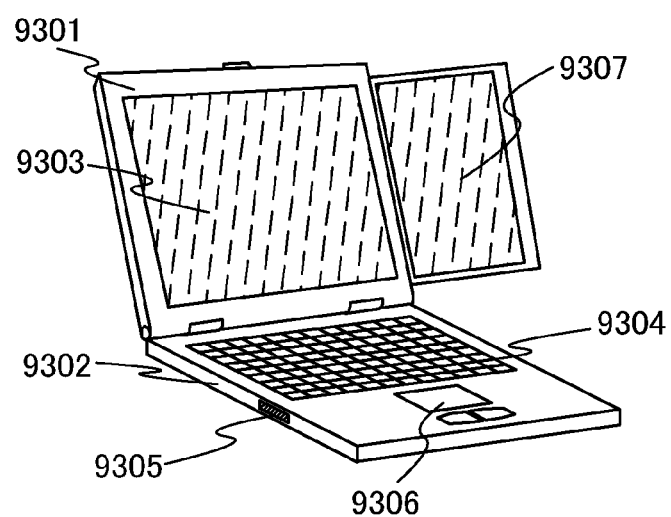
FIG. 13 is a perspective view illustrating an example of a portable computer.

FIG. 13 is a perspective view illustrating an example of a portable computer.

In the portable computer illustrated in FIG. 13, a top housing 9301 having a display portion 9303 and a bottom housing 9302 having a keyboard 9304 can overlap with each other by closing a hinge unit which connects the top housing 9301 and the bottom housing 9302. Thus, the portable computer is conveniently carried. When the user uses the keyboard for input of data, the hinge unit is opened so that the user can input data looking at the display portion 9303.

The bottom housing 9302 includes a pointing device 9306 with which input can be performed, in addition to the keyboard 9304. When the display portion 9303 is a touch screen, the user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stored in the top housing 9301 by being slid therein. With the display portion 9307, a large display screen can be realized. In addition, the user can adjust the angle of a screen of the display portion 9307 which can be stored in the top housing 9301. If the display portion 9307 which can be stored in the top housing 9301 is a touch screen, the user can input data by touching part of the display portion 9307 which can be stored in the top housing 9301.

The display portion 9303 or the display portion 9307 which can be stored in the top housing 9301 is formed using an image display device such as a liquid crystal display panel or a light-emitting display panel with the use of an organic light-emitting element or an inorganic light-emitting element.

In addition, the portable computer illustrated in FIG. 13 can be provided with a receiver and the like and can receive a TV broadcast to display an image on the display portion. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303 and, in addition, only a circuit for displaying a TV broadcast is operated. Thus, power consumption can be minimized, which is advantageous for the portable computer whose battery capacity is limited.

Example 1

In this example, the surface structure and the crystallinity of the microcrystalline semiconductor film in Embodiment 1 will be described with reference to FIGS. 15A and 15B.

First, methods for manufacturing samples will be described.

Sample 1 was manufactured in such a manner that a microcrystalline silicon film was formed by the method described in Embodiment 1.

In Sample 1, a 300-nm-thick silicon nitride film was formed over a glass substrate, and was subjected to plasma treatment. Next, a 5-nm-thick seed crystal was formed under the first condition described in Embodiment 1, and then a 25-nm-thick microcrystalline silicon film was formed under the second condition described in Embodiment 1.

The silicon nitride film was formed by plasma discharge performed under the following condition: silane, hydrogen, nitrogen, and ammonia were introduced as a source gas at flow rates of 15 sccm, 200 sccm, 180 sccm, and 500 sccm, respectively; the pressure in a process chamber was 100 Pa; the substrate temperature was 250° C.; the RF power source frequency was 13.56 MHz; and the power of the RF power source was 200 W.

Plasma treatment for the silicon nitride film was performed by plasma discharge at 300 W under the following condition: dinitrogen monoxide ($N_2O$) was introduced at a flow rate of 400 sccm and the pressure in the process chamber was 60 Pa. Note that the above-described plasma treatment was performed using a parallel-plate plasma apparatus, with the upper electrode temperature and the lower electrode temperature set at 250° C. and 290° C., respectively.

For the deposition of the seed crystal, a plasma CVD method was used in which plasma discharge was performed under the following condition: a source gas was introduced using cycle flow in which the flow rate of hydrogen was 750 sccm, the flow rate of argon was 750 sccm, and the flow rate of silane was set to 5 sccm for 5 seconds and 0.1 sccm for 5 seconds alternately; the pressure in the process chamber was 532 Pa; the RF power source frequency was 13.56 MHz; the power of the RF power source was 150 W; the upper electrode temperature was 250° C.; and the lower electrode temperature was 290° C.

For the deposition of the microcrystalline silicon film, a plasma CVD method was used in which plasma discharge was performed under the following condition: a source gas was introduced using cycle flow in which the flow rate of hydrogen was 1500 sccm, the flow rate of argon was 1500 sccm, and the flow rate of silane was set to 2 sccm for 10 seconds and 0.1 sccm for 5 seconds alternately; the pressure in the process chamber was 10000 Pa; the RF power source frequency was 13.56 MHz; the power of the RF power source was 350 W; the upper electrode temperature was 250° C.; and the lower electrode temperature was 290° C.

In Sample 2 which is a reference example, deposition of a seed crystal under the first condition and deposition of a microcrystalline silicon film under the second condition were performed without using cycle flow, unlike in Sample 1. Specifically, a 300-nm-thick silicon nitride film was formed over a glass substrate, and then was subjected to plasma treatment. Next, a 5-nm-thick seed crystal was formed under the first condition without cycle flow, and then a 30-nm-thick microcrystalline silicon film was formed under the second condition without cycle flow.

The first condition without cycle flow was such that a plasma CVD method was used in which plasma discharge was performed under the following condition: silane, hydrogen, and argon were introduced as a source gas at flow rates of 4 sccm, 750 sccm, and 750 sccm, respectively; the pressure in a process chamber was 532 Pa; the RF power source frequency was 13.56 MHz; the power of the RF power source was 150 W; the upper electrode temperature was 250° C.; and the lower electrode temperature was 290° C.

The second condition without cycle flow was such that a plasma CVD method was used in which plasma discharge was performed under the following condition: silane, hydrogen, and argon were introduced as a source gas at flow rates of 2 sccm, 1500 sccm, and 1500 sccm, respectively; the pressure in a process chamber was 10000 Pa; the RF power source frequency was 13.56 MHz; the power of the RF power source was 350 W; the upper electrode temperature was 250° C.; and the lower electrode temperature was 290° C.

Figure 14A:
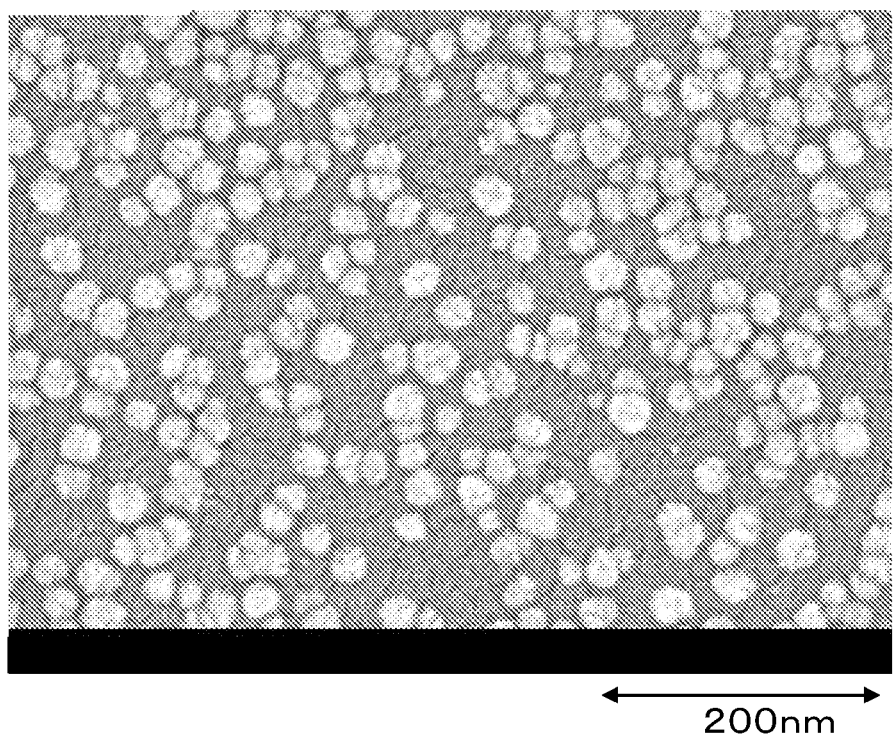
FIGS. 14A and 14B are SEM photographs of seed crystals.
Figure 14B:
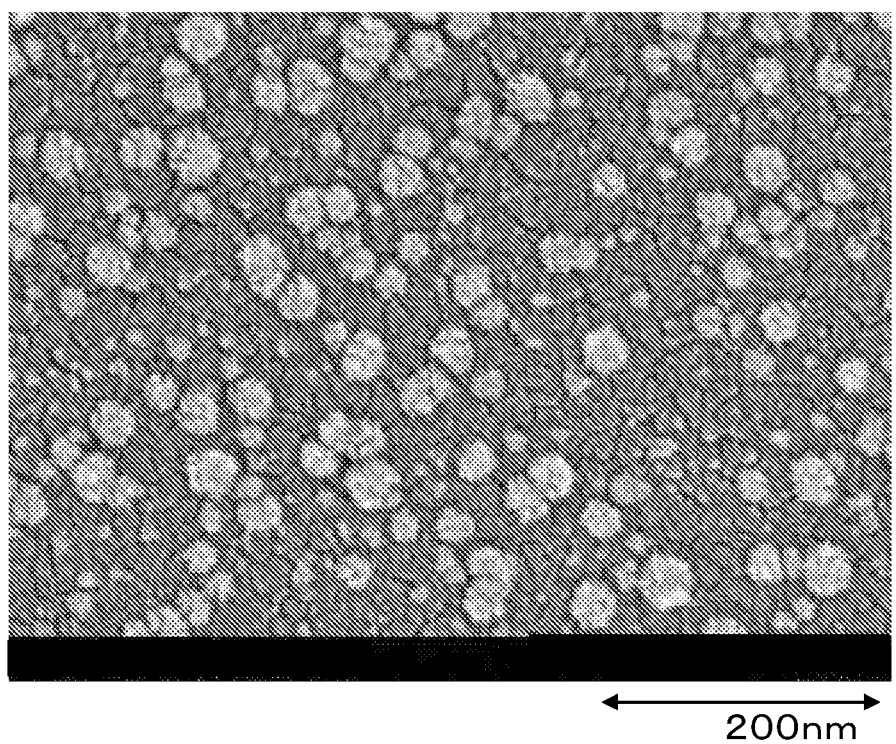

FIGS. 14A and 14B show SEM photographs (magnified 0.2 million times) of seed crystals formed under the first condition of Sample 1 and Sample 2, respectively, which were taken with a scanning electron microscope. Further, FIGS. 15A and 15B show SEM photographs (magnified 0.2 million times) of microcrystalline silicon films formed under the second condition of Sample 1 and Sample 2, respectively, which were taken with a scanning electron microscope. The size of the seed crystals and the size of the mixed phase grains of microcrystalline silicon in Sample 1 are each uniform as compared to those in Sample 2.

The crystallinities (Ic/Ia (the peak intensity of crystalline silicon/the peak intensity of amorphous silicon) of microcrystalline silicon films of Sample 1 and Sample 2 were measured by Raman spectroscopy. The Ic/Ia of Sample 1 was 11.0, and the Ic/Ia of Sample 2 was 9.7.

Figure 15A:
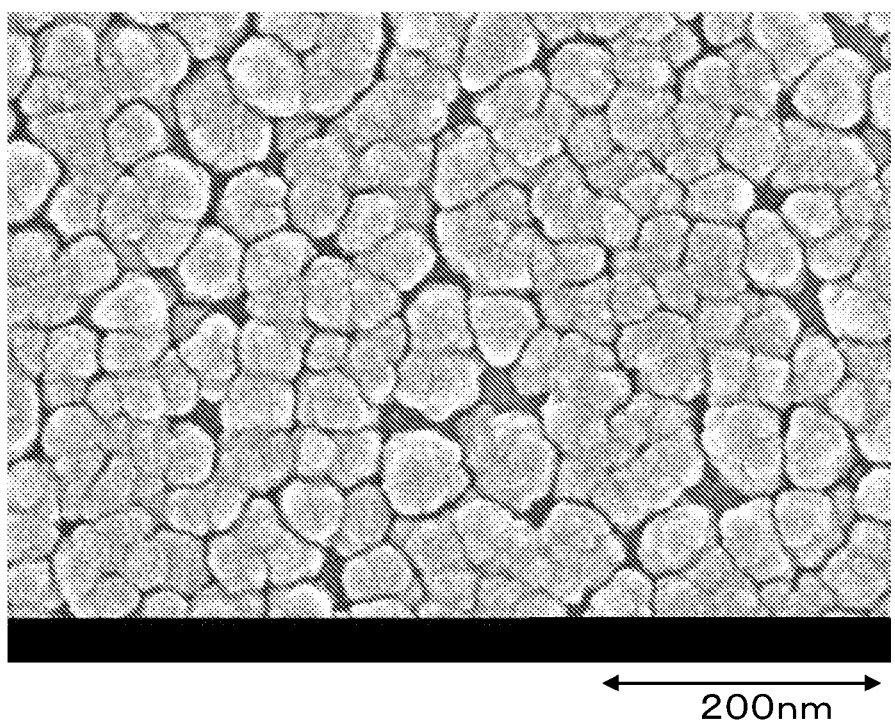
FIGS. 15A and 15B are SEM photographs of microcrystalline silicon films.
Figure 15B:
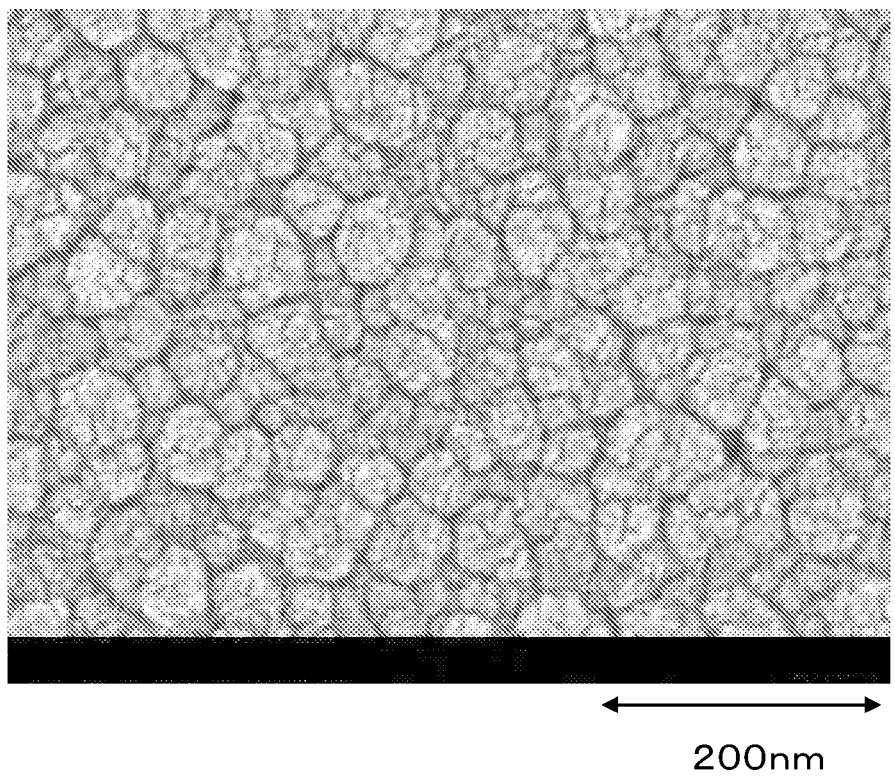

From FIGS. 15A and 15B, it is found that when a microcrystalline silicon film is deposited using cycle flow after formation of a seed crystal using cycle flow, variation in size of the mixed phase grains can be reduced and the crystallinity of the microcrystalline silicon film is increased.

This application is based on Japanese Patent Application serial no. 2010-247527 filed with Japan Patent Office on Nov. 4, 2010, the entire contents of which are hereby incorporated by reference.

What is claimed is:

1. A method for manufacturing a semiconductor device, comprising the steps of:
   forming a seed crystal on an insulating film by a plasma CVD method under a first condition; and
   forming a microcrystalline semiconductor on the seed crystal by a plasma CVD method under a second condition,
   wherein the first condition is a condition that a first source gas and a second source gas are alternately supplied to a process chamber in which a pressure is set to be higher than or equal to 67 Pa and lower than or equal to 13332 Pa,
   wherein the first source gas comprises hydrogen and a deposition gas containing silicon or germanium so that a first flow rate of hydrogen is to be greater than or equal to 50 times and less than or equal to 1000 times a second flow rate of the deposition gas,
   wherein the second source gas comprises hydrogen and the deposition gas containing silicon or germanium so that a third flow rate of the deposition gas is less than the second flow rate of the deposition gas,
   wherein the second condition is a condition that a third source gas and a fourth source gas are alternately supplied to the process chamber in which a pressure is set to be higher than or equal to 1333 Pa and lower than or equal to 13332 Pa,
   wherein the third source gas comprises hydrogen and the deposition gas so that a fourth flow rate of hydrogen is to be greater than or equal to 100 times and less than or equal to 2000 times a fifth flow rate of the deposition gas, and
   wherein the fourth source gas comprises hydrogen and the deposition gas containing silicon or germanium so that a sixth flow rate of the deposition gas is less than the fifth flow rate of the deposition gas.

2. The method for manufacturing a semiconductor device according to claim 1, wherein the seed crystal comprises a mixed phase grain having an amorphous region and a crystalline region.

3. The method for manufacturing a semiconductor device according to claim 1, wherein the first flow rate of hydrogen is the same as that in the second source gas.

4. The method for manufacturing a semiconductor device according to claim 1, wherein the fourth flow rate of hydrogen is the same as that in the fourth source gas.

5. A method for manufacturing a semiconductor device, comprising the steps of:
forming a gate electrode over a substrate;
forming a gate insulating film over the gate electrode;
forming a seed crystal over the gate insulating film under a first condition;
forming a microcrystalline semiconductor film on the seed crystal under a second condition;
forming a first semiconductor film comprising a microcrystalline semiconductor region and an amorphous semiconductor region over the microcrystalline semiconductor film;
forming a first impurity semiconductor film over the first semiconductor film;
forming a second impurity semiconductor film by etching the first impurity semiconductor film;
forming a second semiconductor film by etching the first semiconductor film;
forming a source electrode and a drain electrode over the second impurity semiconductor film; and
forming a third impurity film and a fourth impurity film by etching the second impurity semiconductor film,
wherein the first condition is a condition that a first source gas and a second source gas are alternately supplied to a process chamber in which a pressure is set to be higher than or equal to 67 Pa and lower than or equal to 13332 Pa,
wherein the first source gas comprises hydrogen and a deposition gas containing silicon or germanium so that a first flow rate of hydrogen is to be greater than or equal to 50 times and less than or equal to 1000 times a second flow rate of the deposition gas,
wherein the second source gas comprises hydrogen and the deposition gas containing silicon or germanium so that a third flow rate of the deposition gas is less than the second flow rate of the deposition gas,
wherein the second condition is a condition that a third source gas and a fourth source gas are alternately supplied to the process chamber in which a pressure is set to be higher than or equal to 1333 Pa and lower than or equal to 13332 Pa,
wherein the third source gas comprises hydrogen and the deposition gas so that a fourth flow rate of hydrogen is to be greater than or equal to 100 times and less than or equal to 2000 times a fifth flow rate of the deposition gas, and
wherein the fourth source gas comprises hydrogen and the deposition gas containing silicon or germanium so that a sixth flow rate of the deposition gas is less than the fifth flow rate of the deposition gas.

6. The method for manufacturing a semiconductor device according to claim 5, wherein the seed crystal comprises a mixed phase grain having an amorphous region and a crystalline region.

7. The method for manufacturing a semiconductor device according to claim 5, wherein the first flow rate of hydrogen is the same as that in the second source gas.

8. The method for manufacturing a semiconductor device according to claim 5, wherein the fourth flow rate of hydrogen is the same as that in the fourth source gas.

9. The method for manufacturing a semiconductor device according to claim 5, further comprising the step of forming a barrier region on a side surface of the second impurity semiconductor film and a side surface of the second semiconductor film, wherein the source electrode and the drain electrode are formed over the barrier region.

10. The method for manufacturing a semiconductor device according to claim 5, further comprising the steps of:
forming an insulating film over the source electrode and the drain electrode; and
forming a back gate electrode over the gate electrode with the insulating film interposed therebetween.

11. The method for manufacturing a semiconductor device according to claim 10, wherein the back gate electrode is electrically connected to the gate electrode.

12. A method for manufacturing a semiconductor device, comprising the steps of:
forming a gate electrode over a substrate;
forming a gate insulating film over the gate electrode;
forming a seed crystal over the gate insulating film under a first condition;
forming a microcrystalline semiconductor film on the seed crystal under a second condition;
forming a first semiconductor film comprising a microcrystalline semiconductor region and an amorphous semiconductor region over the microcrystalline semiconductor film;
forming a first impurity semiconductor film over the first semiconductor film;
forming a second impurity semiconductor film by etching the first impurity semiconductor film;
forming a second semiconductor film by etching the first semiconductor film;
forming a source electrode and a drain electrode over the second impurity semiconductor film;
forming a third impurity film and a fourth impurity film by etching the second impurity semiconductor film; and
forming a third semiconductor film and a fourth semiconductor film by etching the second semiconductor film,
wherein the first condition is a condition that a first source gas and a second source gas are alternately supplied to a process chamber in which a pressure is set to be higher than or equal to 67 Pa and lower than or equal to 13332 Pa,
wherein the first source gas comprises hydrogen and a deposition gas containing silicon or germanium so that a first flow rate of hydrogen is to be greater than or equal to 50 times and less than or equal to 1000 times a second flow rate of the deposition gas,
wherein the second source gas comprises hydrogen and the deposition gas containing silicon or germanium so that a third flow rate of the deposition gas is less than the second flow rate of the deposition gas,
wherein the second condition is a condition that a third source gas and a fourth source gas are alternately supplied to the process chamber in which a pressure is set to be higher than or equal to 1333 Pa and lower than or equal to 13332 Pa,
wherein the third source gas comprises hydrogen and the deposition gas so that a fourth flow rate of hydrogen is to be greater than or equal to 100 times and less than or equal to 2000 times a fifth flow rate of the deposition gas, and
wherein the fourth source gas comprises hydrogen and the deposition gas containing silicon or germanium so that a sixth flow rate of the deposition gas is less than the fifth flow rate of the deposition gas.

13. The method for manufacturing a semiconductor device according to claim 12, wherein the seed crystal comprises a mixed phase grain having an amorphous region and a crystalline region.

14. The method for manufacturing a semiconductor device according to claim 12, wherein the first flow rate of hydrogen is the same as that in the second source gas.

15. The method for manufacturing a semiconductor device according to claim 12, wherein the fourth flow rate of hydrogen is the same as that in the fourth source gas.

16. The method for manufacturing a semiconductor device according to claim 12, further comprising the step of forming a barrier region on a side surface of the second impurity semiconductor film and a side surface of the second semiconductor film, wherein the source electrode and the drain electrode are formed over the barrier region.

17. The method for manufacturing a semiconductor device according to claim 12, further comprising the steps of:
    forming an insulating film over the source electrode and the drain electrode; and
    forming a back gate electrode over the gate electrode with the insulating film interposed therebetween.

18. The method for manufacturing a semiconductor device according to claim 17, wherein the back gate electrode is electrically connected to the gate electrode.

* * * * *